(12) United States Patent
Kim et al.

(10) Patent No.: US 8,450,784 B2
(45) Date of Patent: May 28, 2013

(54) SEMICONDUCTOR DEVICE AND METHOD OF FABRICATING THE SAME

(75) Inventors: Jaeyoun Kim, Seoul (KR); Jaihyuk Song, Seongnam-si (KR); Manki Lee, Hwaseong-si (KR); Bongtae Park, Seoul (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 23 days.

(21) Appl. No.: 13/049,746

(22) Filed: Mar. 16, 2011

(65) Prior Publication Data

US 2011/0248317 A1    Oct. 13, 2011

(30) Foreign Application Priority Data

Apr. 9, 2010    (KR) .................. 10-2010-0032801

(51) Int. Cl.
```
H01L 27/108      (2006.01)
H01L 29/94       (2006.01)
H01L 21/70       (2006.01)
```

(52) U.S. Cl.
USPC ....... 257/296; 257/300; 257/390; 257/E27.07

(58) Field of Classification Search
USPC .......... 257/298, 288, 296, E21.679, E21.665, 257/E21.663, E21.662, E21.209, E27.104, 257/208, 211, 393; 438/60, 75, 144, 197, 438/239, 386–399

See application file for complete search history.

(56) References Cited

U.S. PATENT DOCUMENTS

| | | | |
|---|---|---|---|
| 6,395,612 B1 * | 5/2002 | Amanuma | 438/393 |
| 7,145,200 B2 | 12/2006 | Saito et al. | |
| 2003/0124777 A1 * | 7/2003 | Kim | 438/129 |
| 2003/0222302 A1 * | 12/2003 | Saito et al. | 257/314 |
| 2004/0094791 A1 * | 5/2004 | Ito et al. | 257/310 |
| 2006/0170019 A1 * | 8/2006 | Ozaki et al. | 257/295 |

FOREIGN PATENT DOCUMENTS

| | | |
|---|---|---|
| JP | 10-070202 | 3/1998 |
| JP | 2004-165317 | 6/2004 |
| JP | 2005-038884 | 2/2005 |
| JP | 2009-158590 | 7/2009 |

* cited by examiner

*Primary Examiner* — Olik Chaudhuri
*Assistant Examiner* — Wilner Jean Baptiste
(74) *Attorney, Agent, or Firm* — Muir Patent Consulting, PLLC

(57) ABSTRACT

Provided are a semiconductor device and a method of fabricating the same. The semiconductor device includes lateral and upper hydrogen blocking patterns disposed to prevent hydrogen from diffusing into the cell array region. Accordingly, hydrogen is effectively prevented from being trapped in a tunnel dielectric, thereby improving the reliability of the semiconductor device. In the method, when a cell array contact plug is formed, a lateral hydrogen blocking pattern and an upper hydrogen blocking pattern are formed at the same time. Thus, an additional process for forming a hydrogen blocking pattern is unnecessary, thereby simplifying a process.

16 Claims, 23 Drawing Sheets

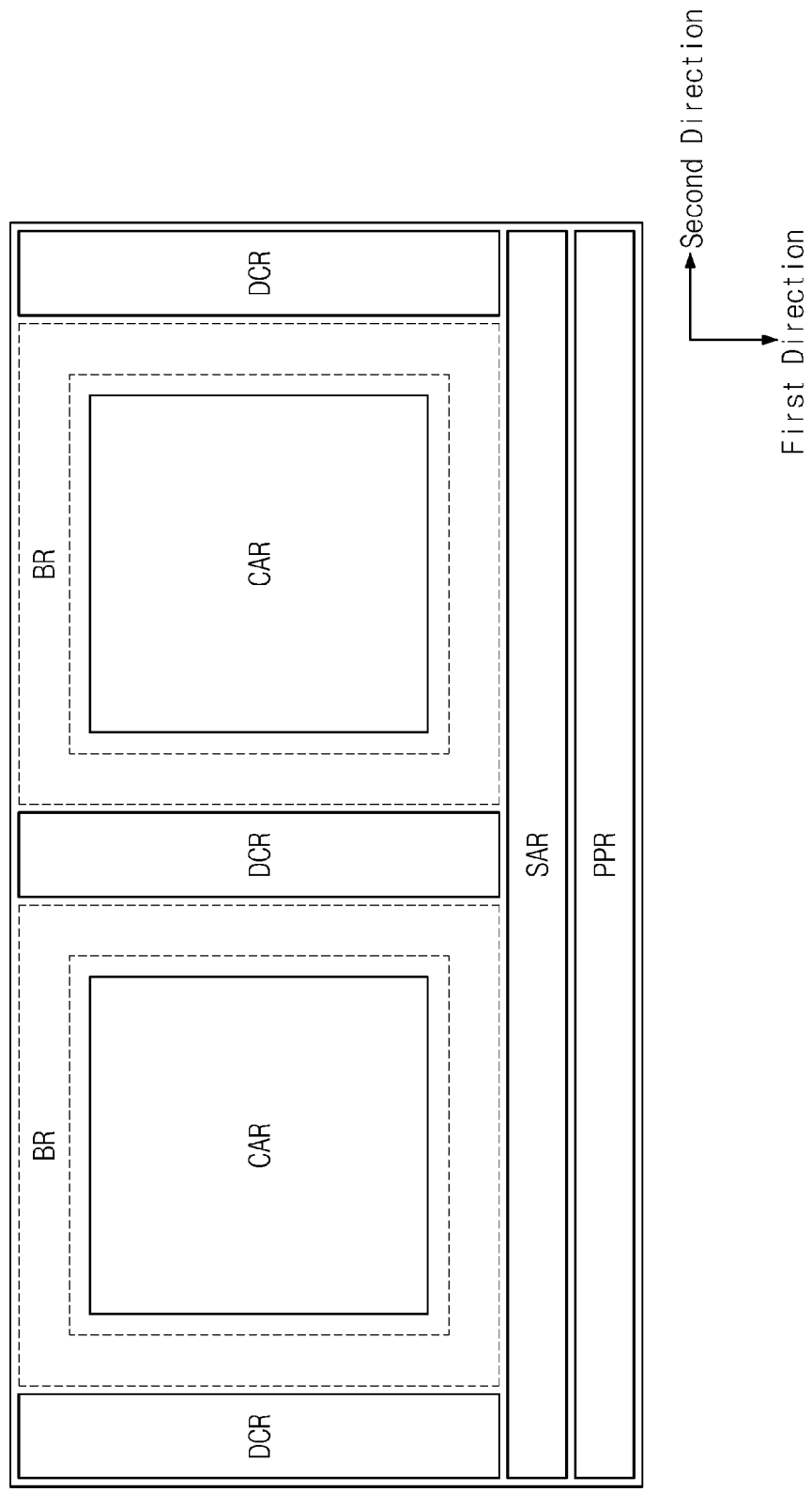

Fig. 2A
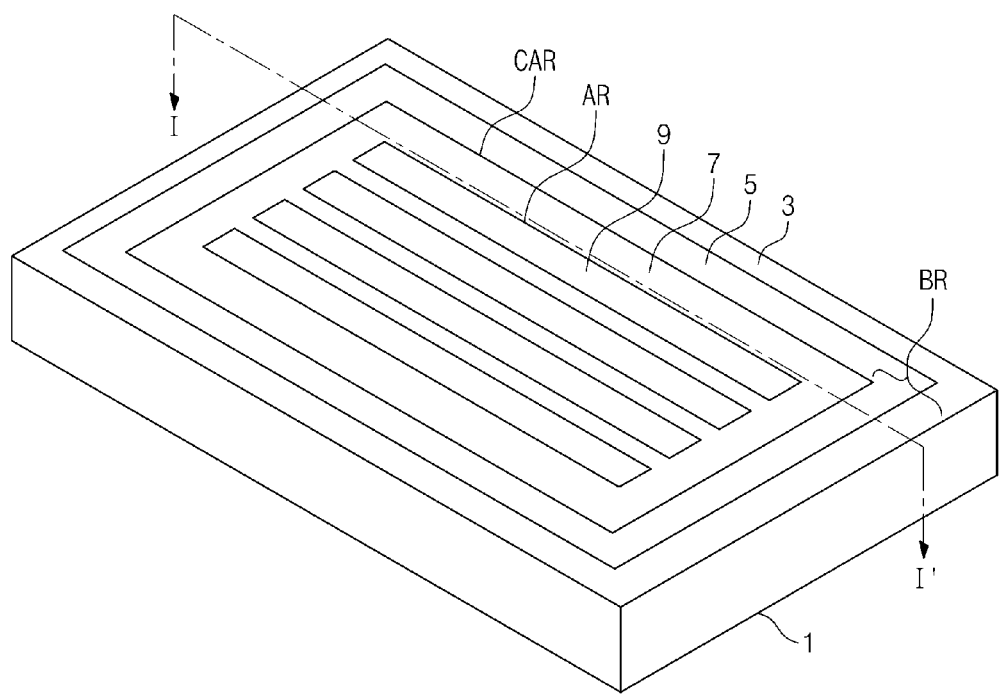
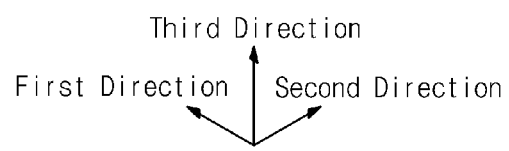

Fig. 3A
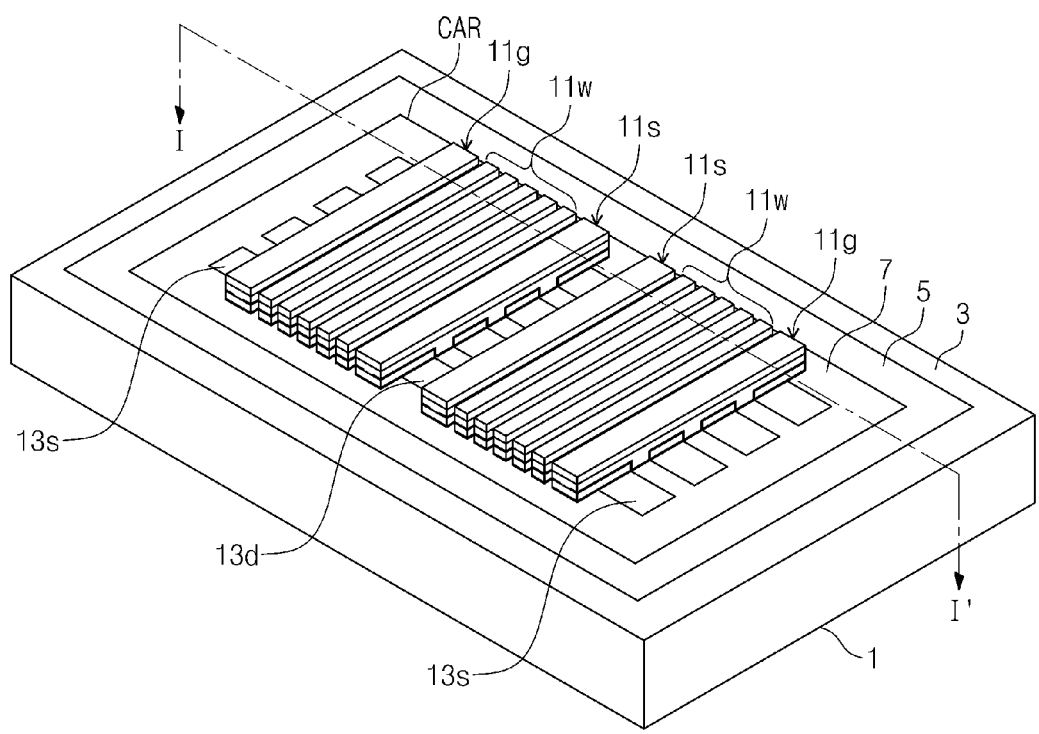
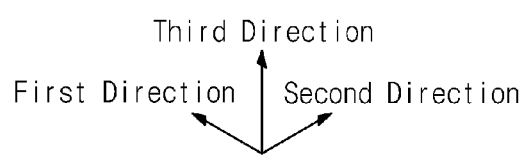

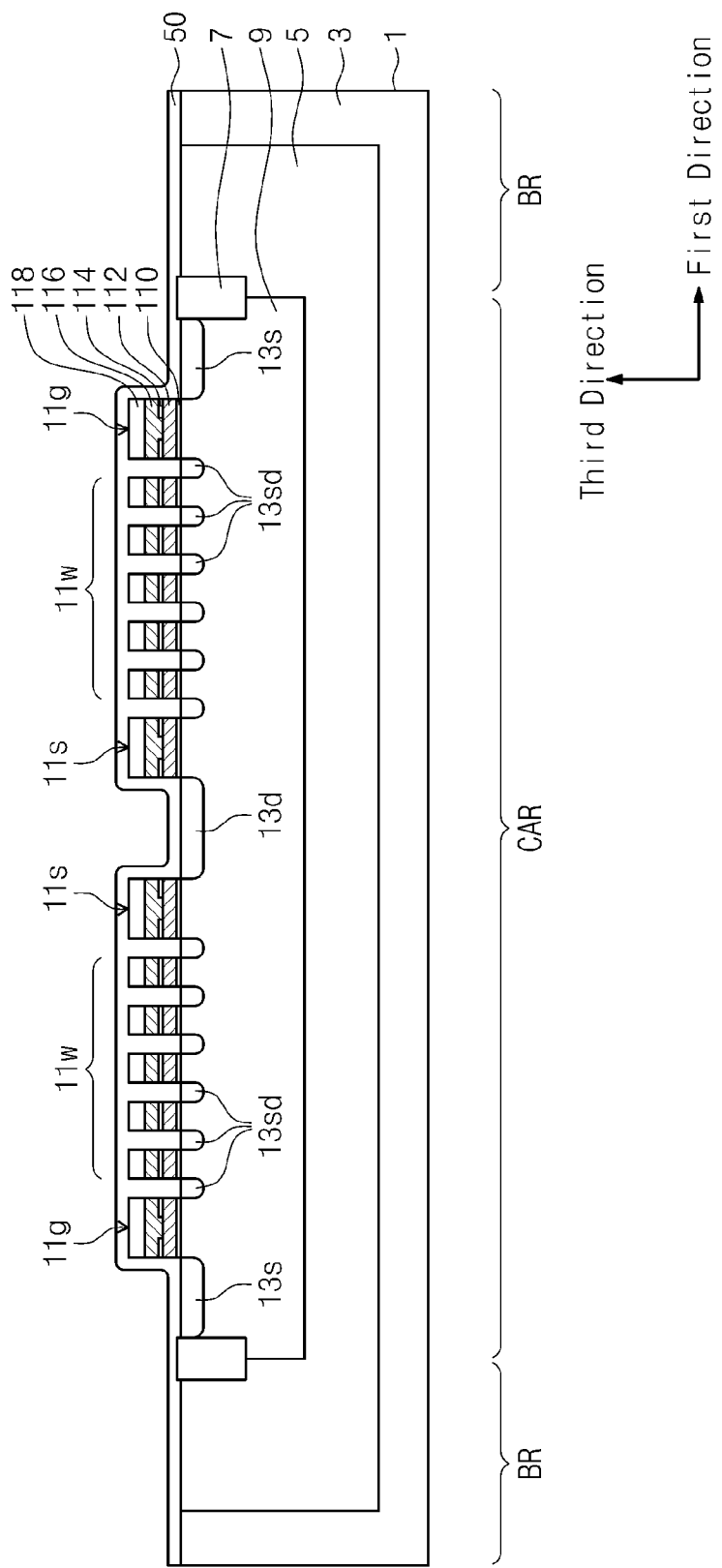

Fig. 4A
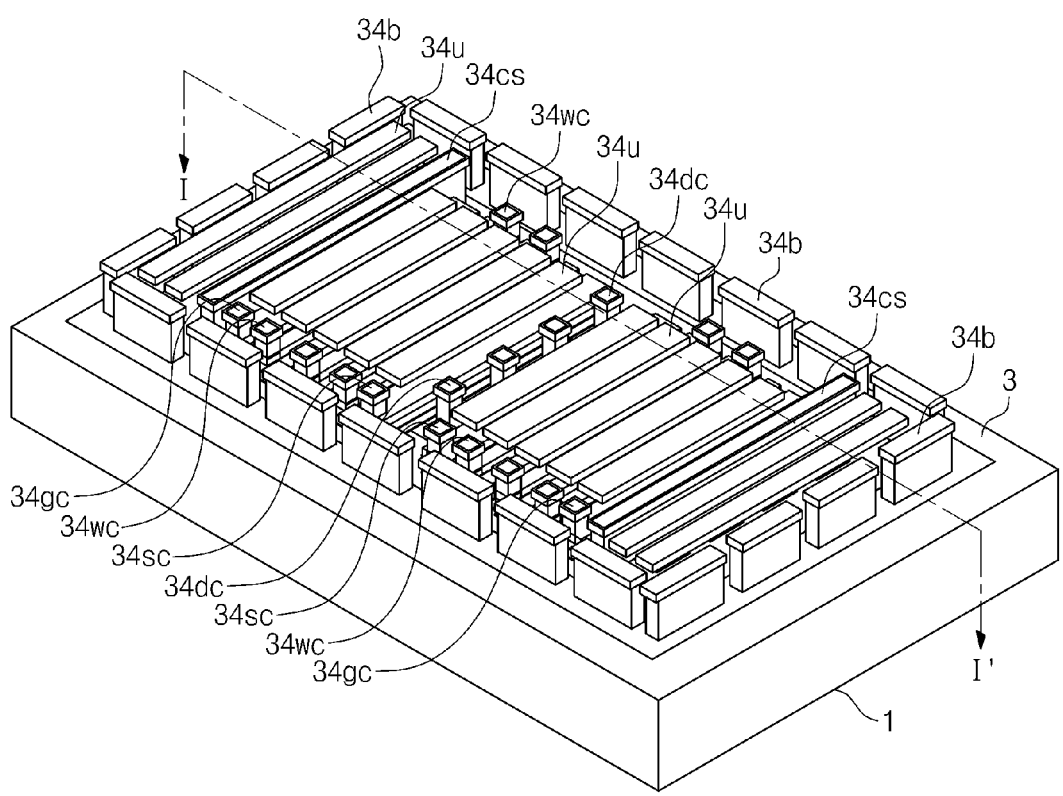
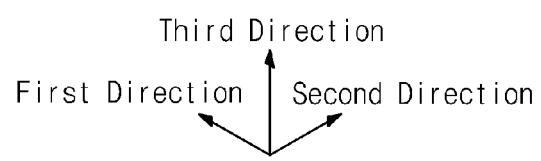

Fig. 5A
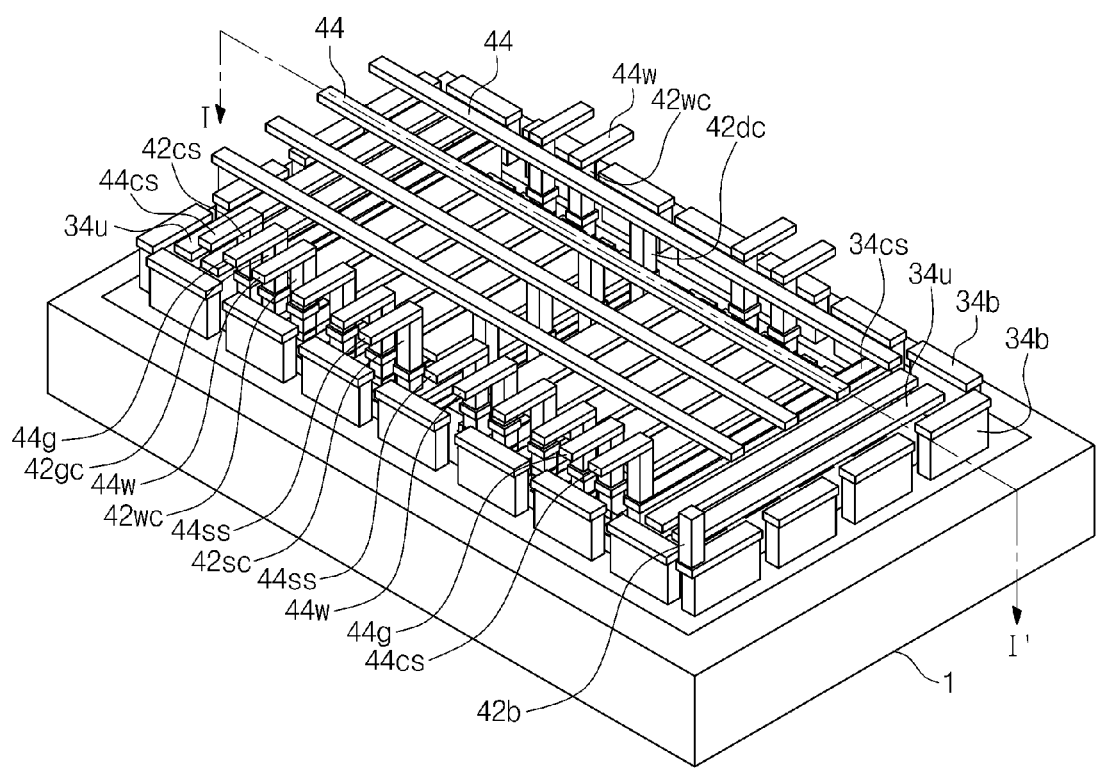
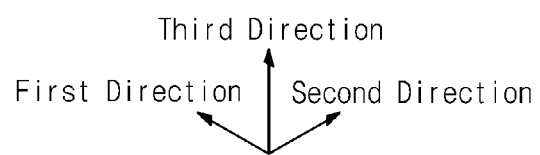

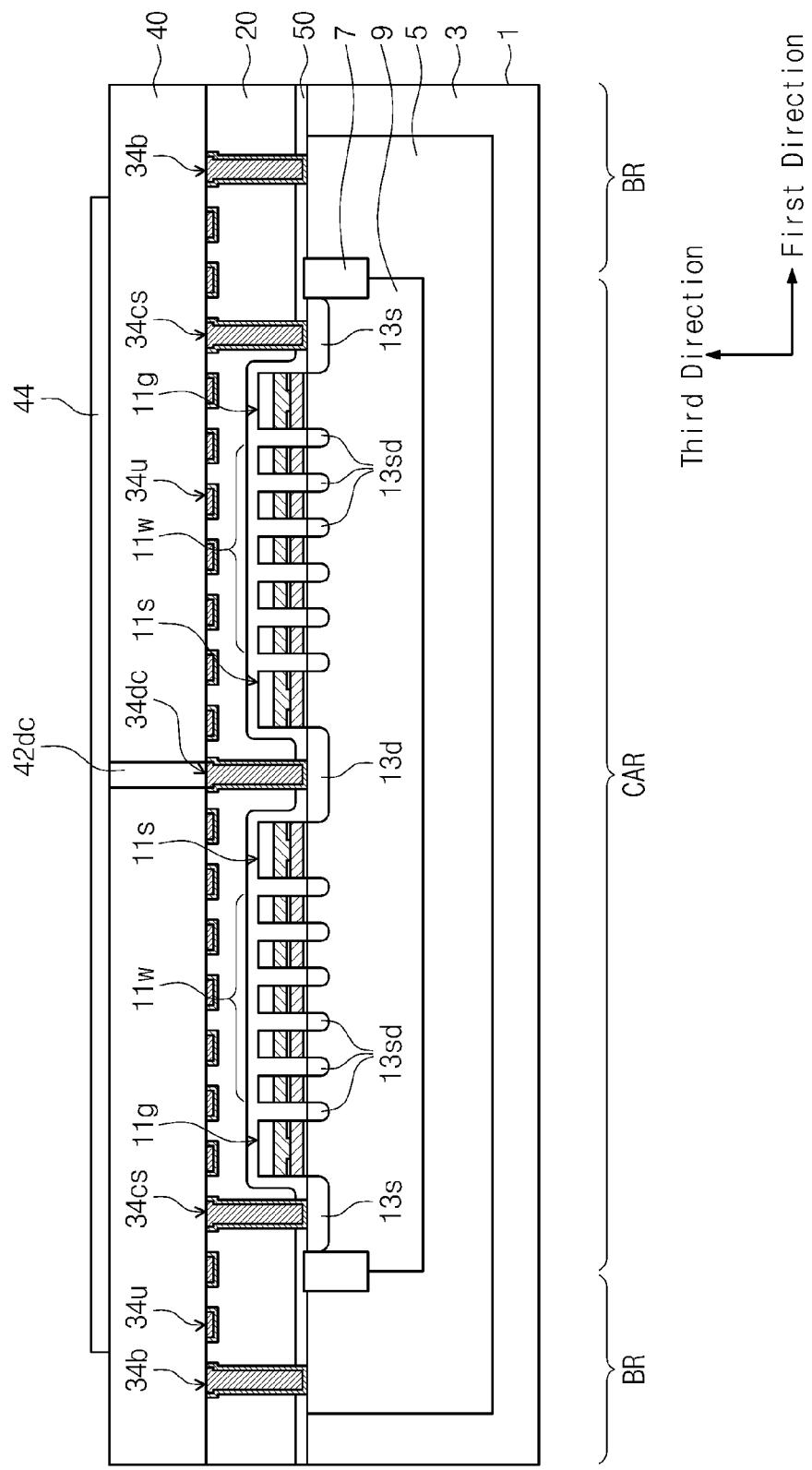

Fig. 7
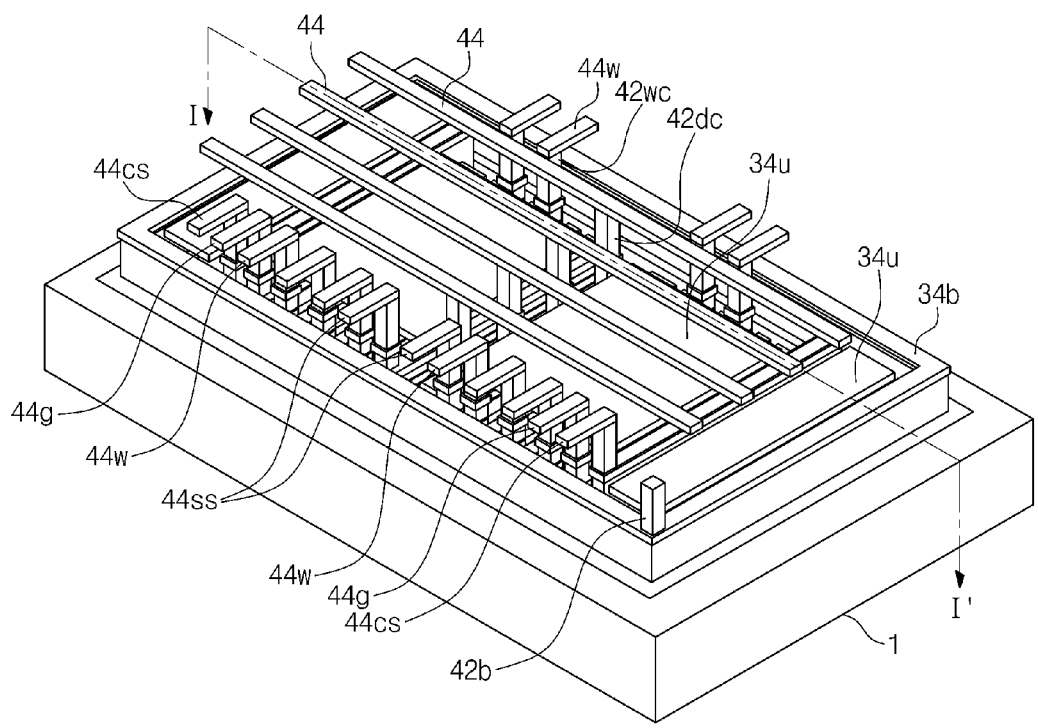
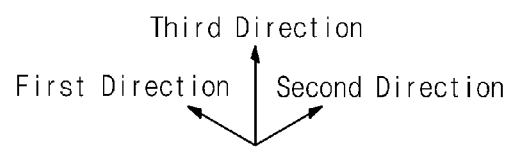

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2010-0032801, filed on Apr. 9, 2010, the entire contents of which are hereby incorporated by reference.

BACKGROUND

The present disclosure herein relates to a semiconductor device and a method of fabricating the semiconductor device.

As semiconductors are highly integrated, various types of research have been carried out to address technical limitations of photolithography processes. For example, a single level cell is changed to a multi level cell to address these limitations. While a unit cell has two states of on/off in a single level cell, a unit cell can have four states or eight or more states in a multi level cell. Because a minute difference between threshold voltages of the cell is sensed for driving in such a multi level cell, an accurate control may be necessary. The reliability of a semiconductor device including such a multi level cell, particularly during programming and erasing, is significantly affected by a trap site formed at an interface of a tunnel oxide layer and a silicon substrate, or a component of an interlayer dielectric functioning as a source of a trap site. Specifically, source gas containing a large amount of hydrogen may be used in a back end process during manufacturing of a semiconductor device. In this case, hydrogen may diffuse and be trapped in a tunnel oxide layer, which may degrade the reliability of a semiconductor device.

SUMMARY

The present disclosure provides a semiconductor device that can improve reliability.

The present disclosure also provides a method of fabricating a semiconductor device, which can improve reliability without an additional process.

Embodiments of the inventive concept provide a semiconductor device including: a semiconductor substrate including a cell array region, a peripheral circuit region, and a boundary region disposed between the cell array region and the peripheral circuit region; gate patterns at the cell array region on the semiconductor substrate; and at least one lateral hydrogen blocking pattern disposed at the boundary region on the semiconductor substrate to surround the cell array region.

In some embodiments, the semiconductor device further may include at least one upper hydrogen blocking pattern disposed in the cell array region above the gate patterns and spaced apart from the gate patterns.

In other embodiments, the upper hydrogen blocking pattern may have one of a parallel bar structure or a flat plate structure.

In still other embodiments, the lateral hydrogen blocking pattern and the upper hydrogen blocking pattern may have upper surfaces at the same height.

In other embodiments, the lateral hydrogen blocking pattern may include a lower pattern having a first width and an upper pattern having a second width different from the first width, and the upper pattern may have the same thickness as that of the upper hydrogen blocking pattern.

In yet other embodiments, the lateral hydrogen blocking pattern and the upper hydrogen blocking pattern may include a conductive pattern and a titanium-containing pattern contacting a side wall and a bottom surface of the conductive pattern.

In further embodiments, the upper hydrogen blocking pattern may be floated.

In still further embodiments, the lateral hydrogen blocking pattern horizontally may have a closed curve or U shape surrounding the cell array region.

In further embodiments, the lateral hydrogen blocking pattern is provided with a plurality of blocks, each block having an upper surface that has a length and a width that are different from each other.

In further embodiments, the semiconductor device further includes a contact plug disposed in the cell array region on the semiconductor substrate, wherein the lateral hydrogen blocking pattern and the contact plug have the same height.

In another embodiment, the semiconductor device may further include: a first impurity implantation region disposed in the cell array region of the semiconductor substrate; and a well disposed in the boundary region of the semiconductor substrate and extended to a lower part of the first impurity implantation region in the cell array region, wherein the lateral hydrogen blocking pattern contacts the well.

In further embodiments, a ground voltage may be applied to the lateral hydrogen blocking pattern.

In yet further embodiments, the gate patterns may include a string selection line and a ground selection line parallel to each other, and a plurality of parallel word lines disposed between the string selection line and the ground selection line, and the semiconductor device further may include: a common source line interconnection disposed at a side of the ground selection line; and a lower bit line contact disposed at a side of the string selection line, wherein the common source line interconnection, the lower bit line contact, and the lateral hydrogen blocking pattern are disposed at the same height.

In yet a further embodiment, the semiconductor device may further include: an upper bit line contact disposed on an upper portion of the lower bit line contact; and a bit line contacting the upper bit line contact and crossing the word line, wherein the bit line has a greater height than that of an upper surface of the lateral hydrogen blocking pattern.

In another embodiment, a semiconductor device is disclosed. The semiconductor device may include a semiconductor substrate including a memory cell array disposed in a cell array region; gate patterns disposed on the semiconductor substrate in the cell array region; and at least one wall-shaped pattern disposed on the semiconductor substrate and surrounding the cell array region. The wall-shaped pattern comprises a material that blocks gas containing hydrogen, and the wall-shaped pattern is configured to block the gas containing hydrogen from reaching the memory cell array.

In yet another embodiment, a top surface of the wall-shaped pattern may be positioned above a top surface of the gate patterns, and a bottom surface of the wall-shaped pattern is positioned below the top surface of the gate patterns.

In other embodiments of the inventive concept, methods of fabricating a semiconductor device may include: preparing a semiconductor substrate including a cell array region, a peripheral circuit region, and a boundary region disposed between the cell array region and the peripheral circuit region; forming gate patterns at the cell array region on the semiconductor substrate; forming a contact plug at the cell array region on the semiconductor substrate; and forming a lateral hydrogen blocking pattern disposed at the boundary region on the semiconductor substrate.

In some embodiments, the forming of the contact plug and the forming of the lateral hydrogen blocking pattern may be performed at the same time.

In other embodiments, the methods may further include forming an upper hydrogen blocking pattern spaced apart from the gate patterns, in the cell array region on the gate patterns.

In still other embodiments, the forming of the contact plug, the forming of the lateral hydrogen blocking pattern, and the forming of the upper hydrogen blocking pattern may be performed at the same time.

In another embodiment, the forming of the contact plug, the forming of the lateral hydrogen blocking pattern, and the forming of the upper hydrogen blocking pattern may include a dual damascene process.

BRIEF DESCRIPTION OF THE DRAWINGS

The accompanying figures are included to provide a further understanding of the inventive concept, and are incorporated in and constitute a part of this specification. The drawings illustrate exemplary embodiments of the inventive concept and, together with the description, serve to explain principles of the inventive concept. In the figures:

FIG. 1 is a plan view illustrating an exemplary semiconductor device according to embodiments of the inventive concept;

FIGS. 2A, 3A, 4A and 5A are perspective views sequentially illustrating an exemplary process of fabricating a semiconductor device according to an embodiment of the inventive concept;

FIGS. 2B, 3B, 4B and 5B are exemplary cross-sectional views taken along line I-I' of FIGS. 2A, 3A, 4A and 5A, respectively;

FIG. 7 is a perspective view illustrating an exemplary semiconductor device according to another embodiment of the inventive concept;

DETAILED DESCRIPTION

Figure 2B:
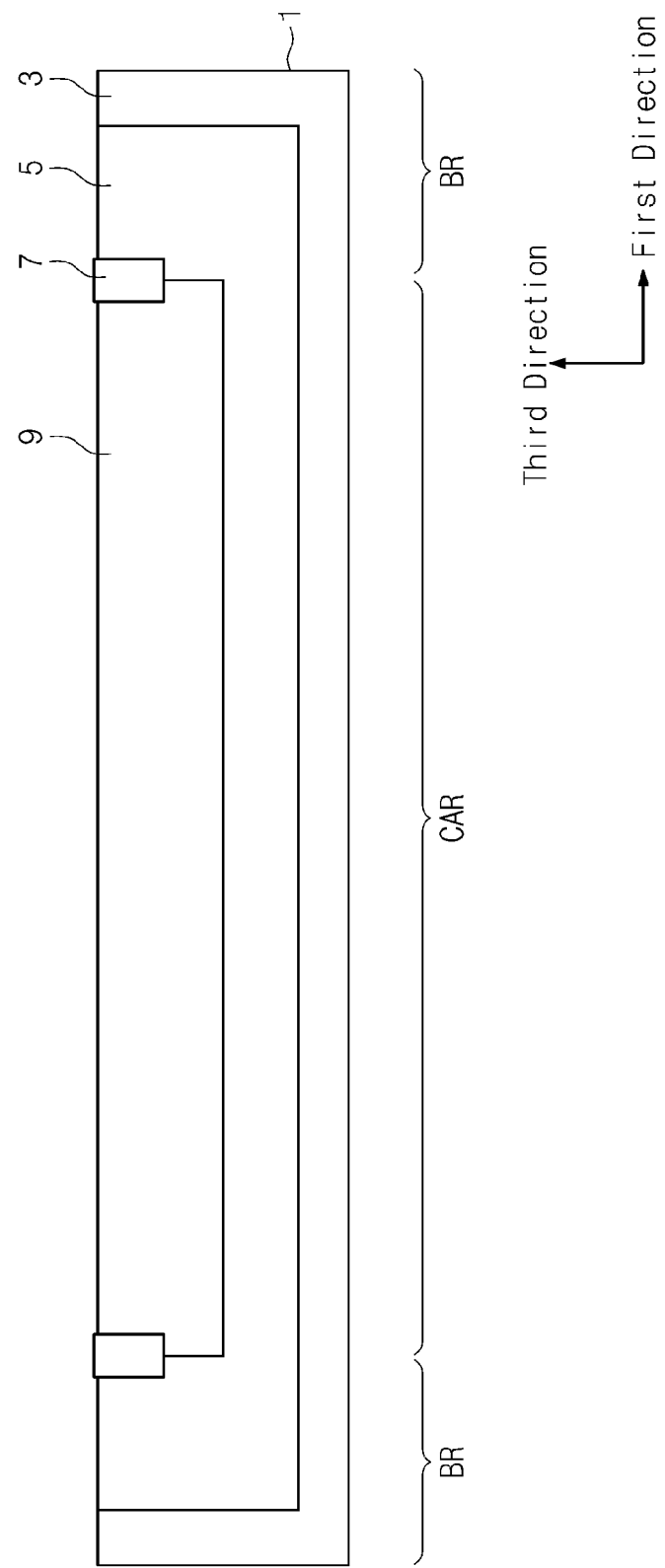

Exemplary embodiments of the inventive concept will be described below in more detail with reference to the accompanying drawings. The inventive concept may, however, be embodied in different forms and should not be construed as limited to the embodiments set forth herein. Like reference numerals refer to like elements throughout this specification.

In the following description, the technical terms are used only to explain a specific exemplary embodiment while not limiting the inventive concept. The meaning of "include," "comprise," "including," or "comprising," specifies a property, a region, a fixed number, a step, a process, an element and/or a component but does not exclude other properties, regions, fixed numbers, steps, processes, elements and/or components. In the specification, it will be understood that when a layer (or film) is referred to as being 'on' another layer or substrate, it can be directly on the other layer or substrate, or intervening layers may also be present.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Also, unless otherwise noted, the terms "contacts" or "contacting," refer to items physically touching each other, without intermediaries in between. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept. As used herein, the singular forms "a," "an" and "the" are intended to include the plural forms as well, unless the context clearly indicates otherwise.

Additionally, the embodiment in the detailed description will be described with sectional views as ideal exemplary views of the inventive concept. In the figures, the dimensions of layers and regions are exaggerated for clarity of illustration. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. For example, although a region is illustrated as a right-angled region, the etch region may be actually round or have a predetermined curvature. Areas exemplified in the drawings have general properties, and are used to illustrate a specific shape of a device region. Thus, this should not be construed as limited to the scope of the inventive concept.

Hereinafter, exemplary embodiments of the inventive concept will be described in detail with reference to the accompanying drawings.

FIG. 1 is a plan view illustrating an exemplary semiconductor device according to embodiments of the inventive concept.

Referring to FIG. 1, the semiconductor device according to the disclosed embodiments may include a cell array region (CAR), a boundary region (BR), a peripheral circuit region (PPR), a sense amplification region (SAR), and a decoding circuit region (DCR). In the cell array region (CAR), a plurality of memory cells and bit lines and word lines for an electrical connection to the memory cells may be disposed. In the peripheral circuit region (PPR), circuits for driving the memory cells may be disposed, and in the sense amplification region (SAR), circuits for reading information stored in the memory cells may be disposed. The boundary region (BR) may surround the cell array region (CAR) and may be disposed between the cell array region (CAR) and the decoding circuit region (DCR), and between the cell array region (CAR) and the sense amplification region (SAR). The bit lines and word lines disposed in the cell array region (CAR) may be electrically connected to the decoding circuit region (DCR) and the sense amplification region (SAR) through an interconnection structure passing by the upper side of the boundary region (BR).

The boundary region (BR) is not limited to the disposition of FIG. 1, and thus, may surround two or more cell array regions (CAR). At least one of the decoding circuit region (DCR) and the sense amplification region (SAR) as well as the cell array region (CAR) may be disposed in the boundary region (BR).

<First Embodiment>

FIGS. 2A, 3A, 4A and 5A are perspective views illustrating an exemplary process of fabricating a semiconductor device according to an embodiment of the inventive concept. FIGS. 2B, 3B, 4B and 5B are exemplary cross-sectional views taken along line I-I' of FIGS. 2A, 3A, 4A and 5A, respectively. FIG. 5C is a plan view illustrating the semiconductor device of FIG. 5A. For clearer understanding, interlayer dielectrics are omitted from the perspective views.

Referring to FIGS. 2A and 2B, for example, a first type well 3 is formed in a semiconductor substrate 1. Alternatively, the semiconductor substrate 1 may be doped with first type impurities to form the first type well 3. A second type well 5 is formed to have a depth smaller than that of the first type well 3. A device isolation layer 7 is formed in the semiconductor substrate 1 to define an active region (AR). For example, the active region (AR) may include a plurality of parallel lines extending in a first direction. The device isolation layer 7 may define the cell array region (CAR) and the boundary region (BR). For example, an area within the boundaries of the device isolation layer 7 may be considered the cell array region (CAR) while an area outside the boundaries of the device isolation region may be considered the boundary region (BR). The device isolation layer 7 may be formed before forming the first type well 3 and the second type well 5. For example, a first type impurity implantation region 9 may be formed in the active region (AR) defined by the device isolation layer 7 in the cell array region (CAR).

Referring to FIGS. 3A and 3B, a ground selection line 11g that extends in a second direction crossing the active region (AR), a string selection line 11s that is parallel to the ground selection line 11g, and word lines 11w that are parallel to each other between the ground selection line 11g and the string selection line 11s are formed. In one embodiment, the ground selection line 11g, the string selection line 11s, and the word lines 11w constitute a single cell string. The cell string may be symmetrically and repeatedly disposed on the cell array region (CAR). The ground selection line 11g, the string selection line 11s, and the word lines 11w may include a tunnel dielectric 110, a floating gate pattern 112, a blocking dielectric 114, a control gate pattern 116, and a capping layer pattern 118, which are sequentially stacked. In the ground selection line 11g and the string selection line 11s, the control gate pattern 116 may pass through the blocking dielectric 114 and may contact the floating gate pattern 112. In one embodiment, the blocking dielectric 114 is constituted by a triple layer including a silicon oxide layer, a silicon nitride layer, and a silicon oxide layer. The floating gate pattern 112 may overlap the active region (AR). The ground selection line 11g, the string selection line 11s, and the word lines 11w may be formed using various well-known methods. The floating gate pattern 112 may be formed with the device isolation layer 7 using a self-aligned method. The ground selection line 11g, the string selection line 11s, and the word lines 11w may be used as an ion implantation process mask to form second type impurity implantation regions 13s, 13sd, and 13d in the semiconductor substrate 1 adjacent to the ground selection line 11g, the string selection line 11s, and the word lines 11w. The second type impurity implantation region 13s adjacent to the ground selection line 11g may constitute a common source region. The second type impurity implantation region 13d disposed between the neighboring two string selection lines 11s may be a common drain region. Referring to FIG. 3B, a passivation layer 50 may be conformally formed on a whole surface of the semiconductor substrate 1. For example, the passivation layer 50 may include at least one selected from the group consisting of a silicon nitride layer and a silicon oxynitride layer. The passivation layer 50 may protect the cell array region from moisture and contamination, and may function as an etch stop layer.

Figure 4B:
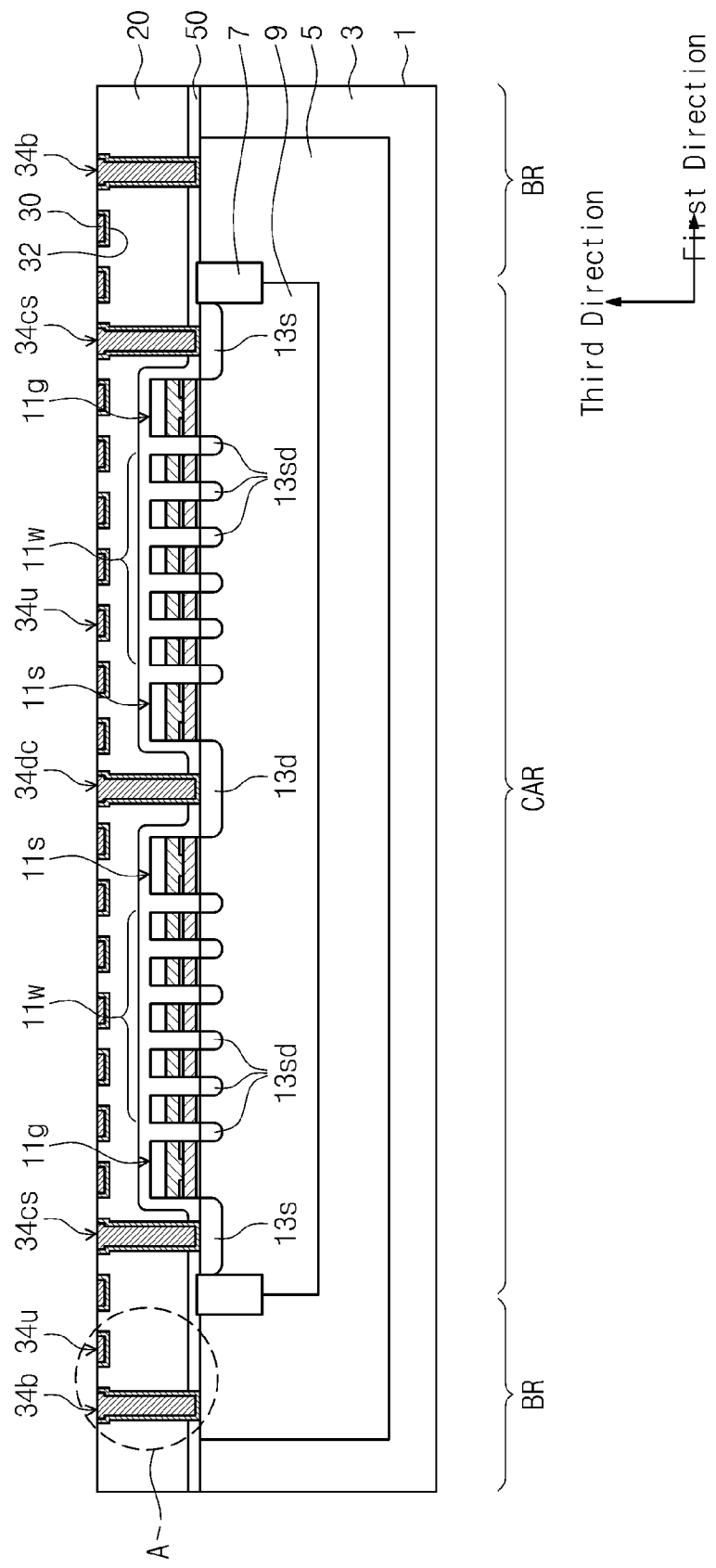

Referring to FIGS. 4A and 4B, a first interlayer dielectric 20 may be stacked on the whole surface of the semiconductor substrate 1 where the passivation layer 50 is formed. A contact plug, such as first bit line contact 34dc and a first common source interconnection 34cs, which pass through the first interlayer dielectric 20 and the passivation layer 50 to respectively contact the common drain region 13d and the common source region 13s, may be formed in the cell array region (CAR). Simultaneously, lateral hydrogen blocking pattern 34b, which passes through the first interlayer dielectric 20 and the passivation layer 50 to contact the second type well 5, may be formed in the boundary region (BR), and upper hydrogen blocking pattern 34u may be formed in the upper portion of the first interlayer dielectric 20 in both the boundary region BR and the cell array region (CAR). The first bit line contact 34dc, the first common source interconnection 34cs, the lateral hydrogen blocking pattern 34b, and the upper hydrogen blocking pattern 34u each may include a conductive pattern 30 and a titanium-containing pattern 32 contacting the side wall and the bottom surface of the conductive pattern 30. In one embodiment, the conductive pattern 30 may include various metals such as tungsten, titanium, tantalum, copper, and aluminum. In addition, the titanium-containing pattern 32 may include at least one selected from the group including titanium and a titanium nitride layer. The upper hydrogen blocking pattern 34u may be spaced apart from the lines 11g, 11w, and 11s. That is, part of the interlayer dielectric may remain between the upper hydrogen blocking pattern 34u and the lines 11g, 11w, and 11s. In one embodiment, the upper hydrogen blocking pattern 34u may include a plurality of bar shapes extending in a line in the second direction. The bar shapes may be parallel. In addition, the bar shapes may be patterned to include bars so that centers of any two consecutive bars do not vertically align with centers of two consecutive lines 11g, 11w, or 11s.

Referring to FIG. 4A, while the first bit line contact 34dc, the first common source interconnection 34cs, the lateral hydrogen blocking pattern 34b, and the upper hydrogen blocking patterns 34u are formed, first ground selection line contact 34gc, first word line contact 34wc, and first string selection line contact 34sc may be formed on the cell array region (CAR). The first ground selection line contact 34gc disposed at an end of the ground selection line 11g may pass through the capping layer pattern 118 of the ground selection line 11g and contact the control gate pattern 116 of the ground selection line 11g. The first string selection line contact 34sc disposed at an end of the string selection line 11s may pass through the capping layer pattern 118 of the string selection line 11s and contact the control gate pattern 116 of the string selection line 11s. The first word line contacts 34wc disposed at an end of the word lines 11w may pass through the capping layer pattern 118 of the word lines 11w and contact the control gate pattern 116 of the word lines 11w. In one embodiment, the hydrogen blocking pattern 34b and 34u, the first contacts 34gc, 34wc, and 34sc, and the first common source interconnection 34cs have upper surfaces at the same height.

Referring to FIG. 4A, the lateral hydrogen blocking pattern 34b may surround the cell array region CAR (i.e. may be formed around an area of the cell array region CAR) and have a plurality of bar shapes spaced apart from each other. For example, the bar shapes may be arranged successively with spaces between them to form a wall pattern along the lateral edges of the cell array region. In one embodiment, the wall pattern may include vertical wall structures that have a height in the third direction greater than a thickness in a first direction, and that form a closed shape (e.g., a rectangle) when viewed from the third direction. A length and a width of the upper surfaces of the bar shapes of lateral hydrogen blocking pattern 34b may be different.

Figure 4C:
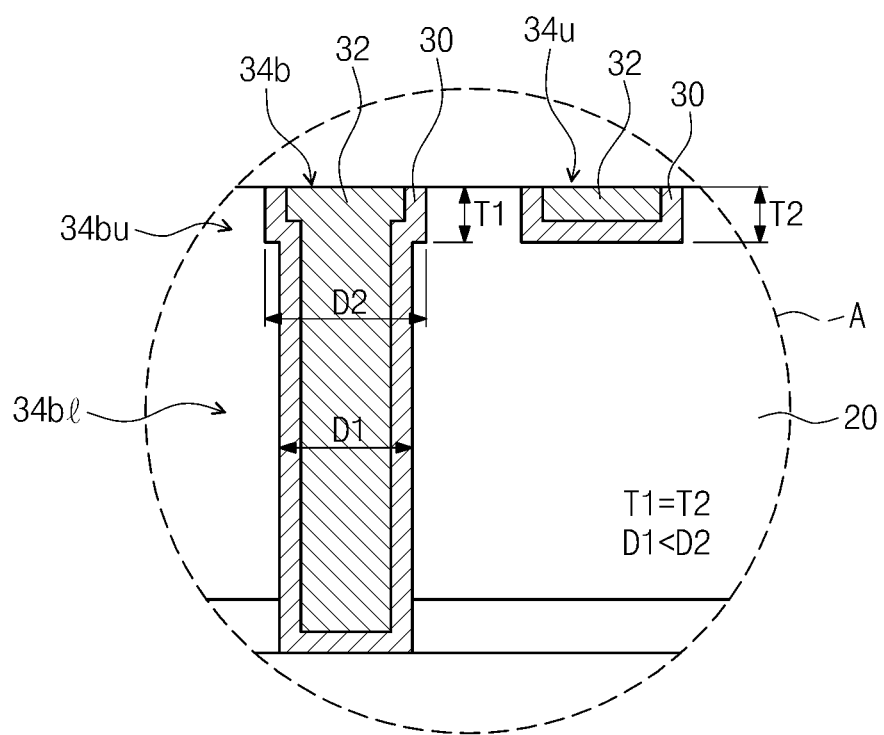
FIG. 4C is an enlarged view illustrating a portion A of FIG. 4B.

FIG. 4C is an enlarged view illustrating a portion A of FIG. 4B.

Referring to FIG. 4C, the lateral hydrogen blocking pattern 34b may have a T-shaped cross section that is parallel to a plane defined by the first direction and a third direction. That is, the lateral hydrogen blocking pattern 34b may include a first sub lateral hydrogen blocking pattern 34bl at the lower portion, and a second sub lateral hydrogen blocking pattern 34bu at the upper portion. A width D1 of the first sub lateral hydrogen blocking pattern 34bl in the first direction is smaller than a width D2 of the second sub lateral hydrogen blocking pattern 34bu in the first direction. The second sub lateral hydrogen blocking pattern 34bu may have a thickness T1 that is equal to a thickness T2 of the upper hydrogen blocking pattern 34u.

Figure 6A:
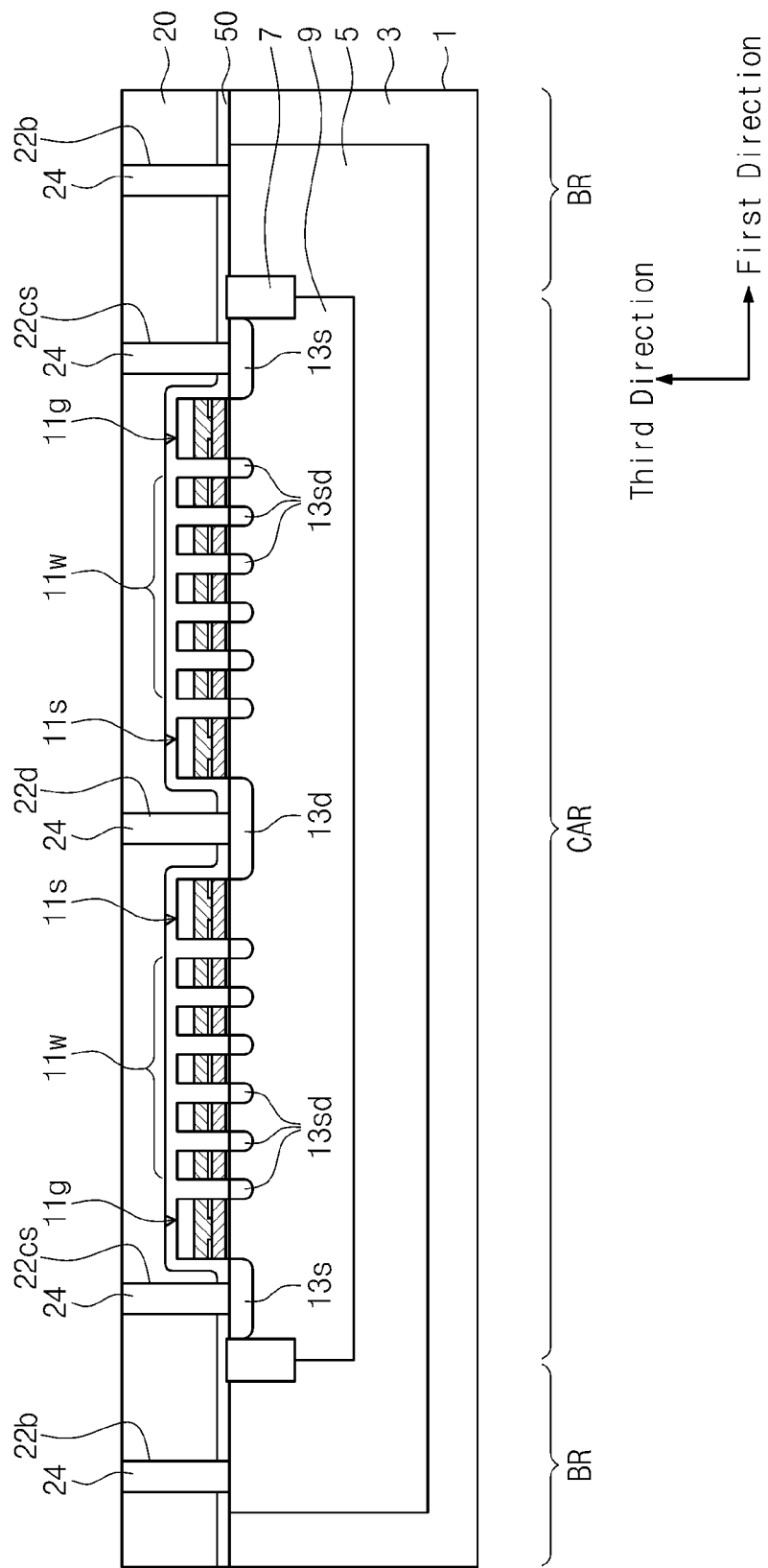
FIGS. 6A, 6B and 6C are cross-sectional views sequentially illustrating an exemplary process of fabricating a semiconductor device having the cross section of FIG. 4B.
Figure 6B:
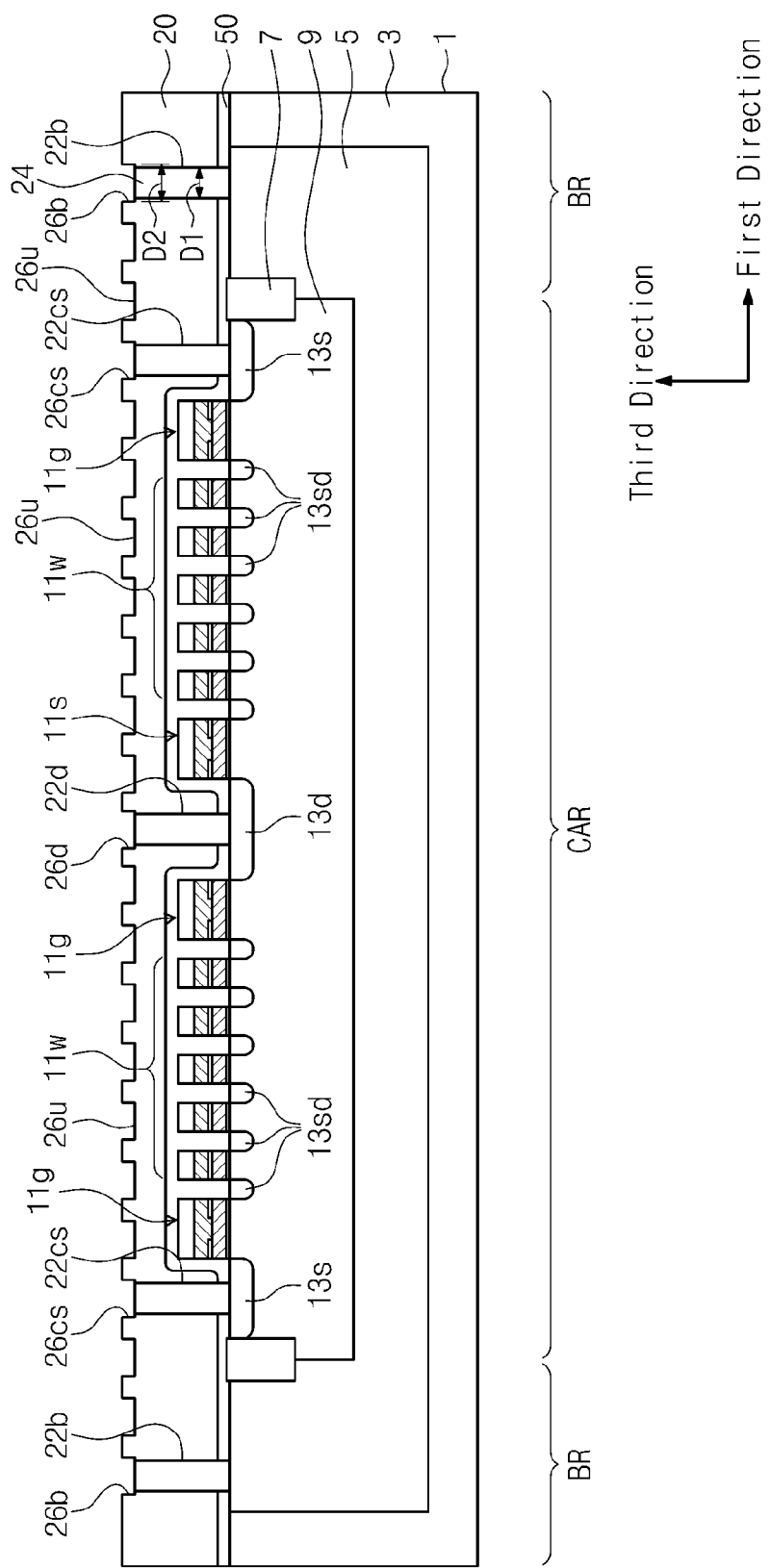
Figure 6C:
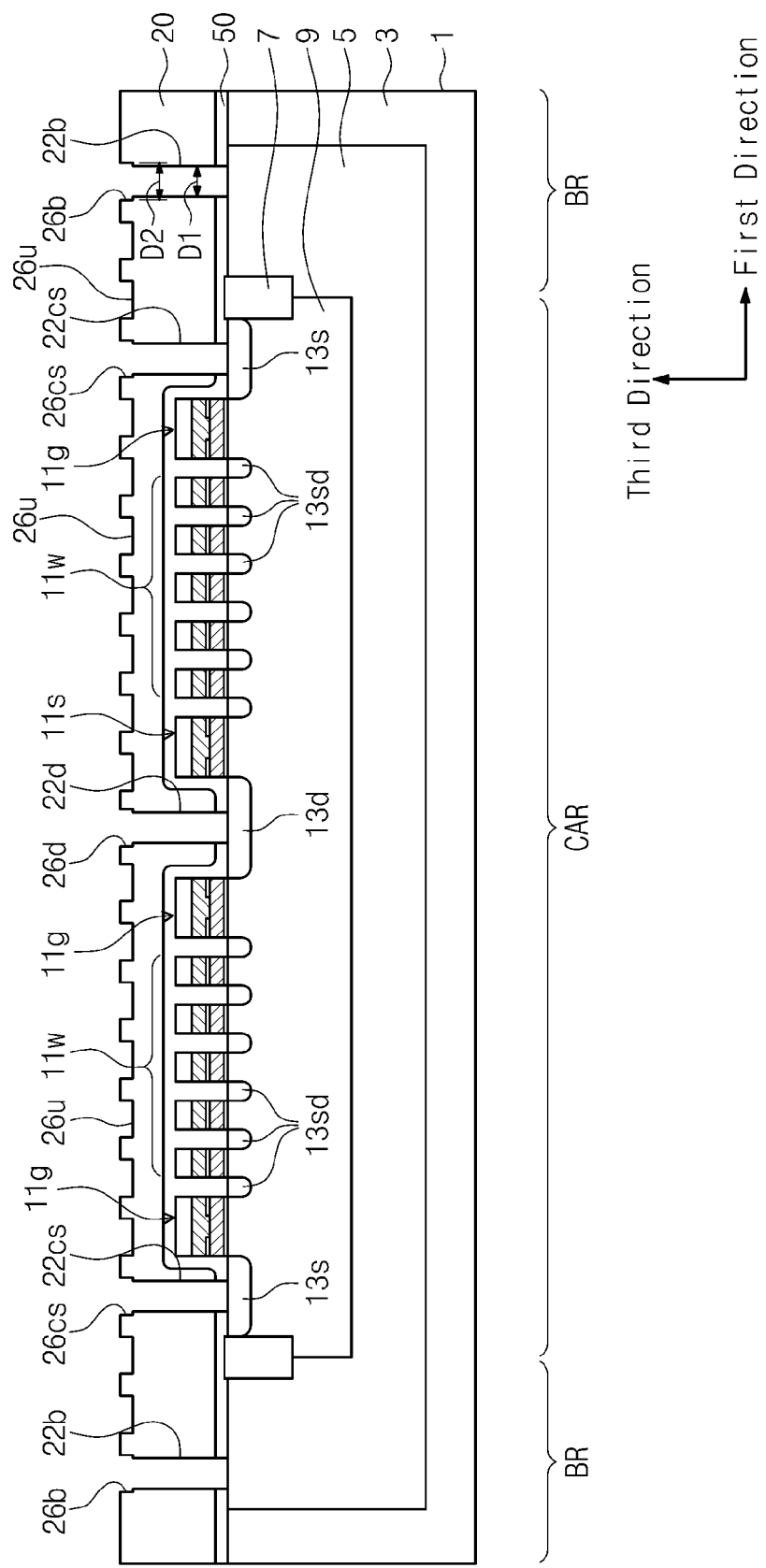

The first bit line contact 34dc, the first common source interconnection 34cs, the lateral hydrogen blocking pattern 34b, and the upper hydrogen blocking pattern 34u may be formed, for example, using a dual damascene process. This will now be described with reference to FIGS. 6A through 6C. FIGS. 6A, 6B and 6C are cross-sectional views sequentially illustrating an exemplary process of fabricating a semiconductor device having the cross section of FIG. 4B.

Referring to FIG. 6A, the first interlayer dielectric 20 may be stacked on the whole surface of the semiconductor substrate 1 in the same state as illustrated in FIG. 3B (e.g., on a top surface), and then, may be planarized. The first interlayer dielectric 20 and the passivation layer 50 may be patterned to form first bit line contact hole 22d, first common source line groove 22cs, and first lateral hydrogen blocking holes 22b. The first bit line contact hole 22d may expose the common drain region 13d. The first common source line groove 22cs may expose the common source region 13s. The first lateral hydrogen blocking holes 22b may expose the second type well 5. The first lateral hydrogen blocking holes 22b may be formed to have the first width D1. Although not shown in FIG. 6A, while the first bit line contact hole 22d, the first common source line groove 22cs, and the first lateral hydrogen blocking holes 22b are formed, holes defining the first contacts 34gc, 34wc, and 34sc may be formed. The first bit line contact hole 22d, the first common source line groove 22cs, and the first lateral hydrogen blocking holes 22b may be filled with a sacrificial layer 24, and then, may be planarized. For example, the sacrificial layer 24 may include silicon organic hydrate (SOH). In one embodiment, the sacrificial layer 24 has approximately the same anisotropic dry etch rate as that of the first interlayer dielectric 20. However, the sacrificial layer 24 may be removed through an ashing process, or have a different isotropic dry/wet etch selectivity from that of the first interlayer dielectric 20 so that the sacrificial layer 24 can be selectively removed.

Referring to FIG. 6B, the sacrificial layer 24 and the first interlayer dielectric 20 may be partially patterned to form upper hydrogen blocking grooves 26u, second bit line hole 26d, second common source line groove 26cs, and second lateral hydrogen blocking holes 26b. The second lateral hydrogen blocking holes 26b may have the width D2 that is greater than the width D1 of the first lateral hydrogen blocking holes 22b. The upper hydrogen blocking grooves 26u, the second bit line hole 26d, the second common source line groove 26cs, and the second lateral hydrogen blocking holes 26b may have a smaller depth than those of the first bit line contact hole 22d, the first common source line groove 22cs, and the first lateral hydrogen blocking holes 22b. In one embodiment, because the sacrificial layer 24 has the same/similar anisotropic dry etch selectivity to that of the first interlayer dielectric 20, the sacrificial layer 24 and the first interlayer dielectric 20 may be etched substantially at the same time.

Referring to FIG. 6C, the sacrificial layer 24 may be removed in the first bit line contact hole 22d, the first common source line groove 22cs, and the first lateral hydrogen blocking holes 22b. The sacrificial layer 24 may be removed through an ashing process or a wet etching process. Accordingly, the common drain region 13d, the common source region 13s, and the second type well 5 may be exposed.

Thereafter, referring to FIG. 4B, a titanium-containing layer may be conformally formed on the semiconductor substrate 1, and a conductive layer may be stacked to fill the first bit line contact hole 22d, the first common source line groove 22cs, and the first lateral hydrogen blocking holes 22b, as well as the second bit line hole 26d, the second common source line groove 26cs, and the second lateral hydrogen blocking holes 26b, and then, may be planarized to form the semiconductor device illustrated in FIG. 4B. During the planarizing process, the upper hydrogen blocking pattern 34u can prevent a dishing phenomenon.

Figure 5C:
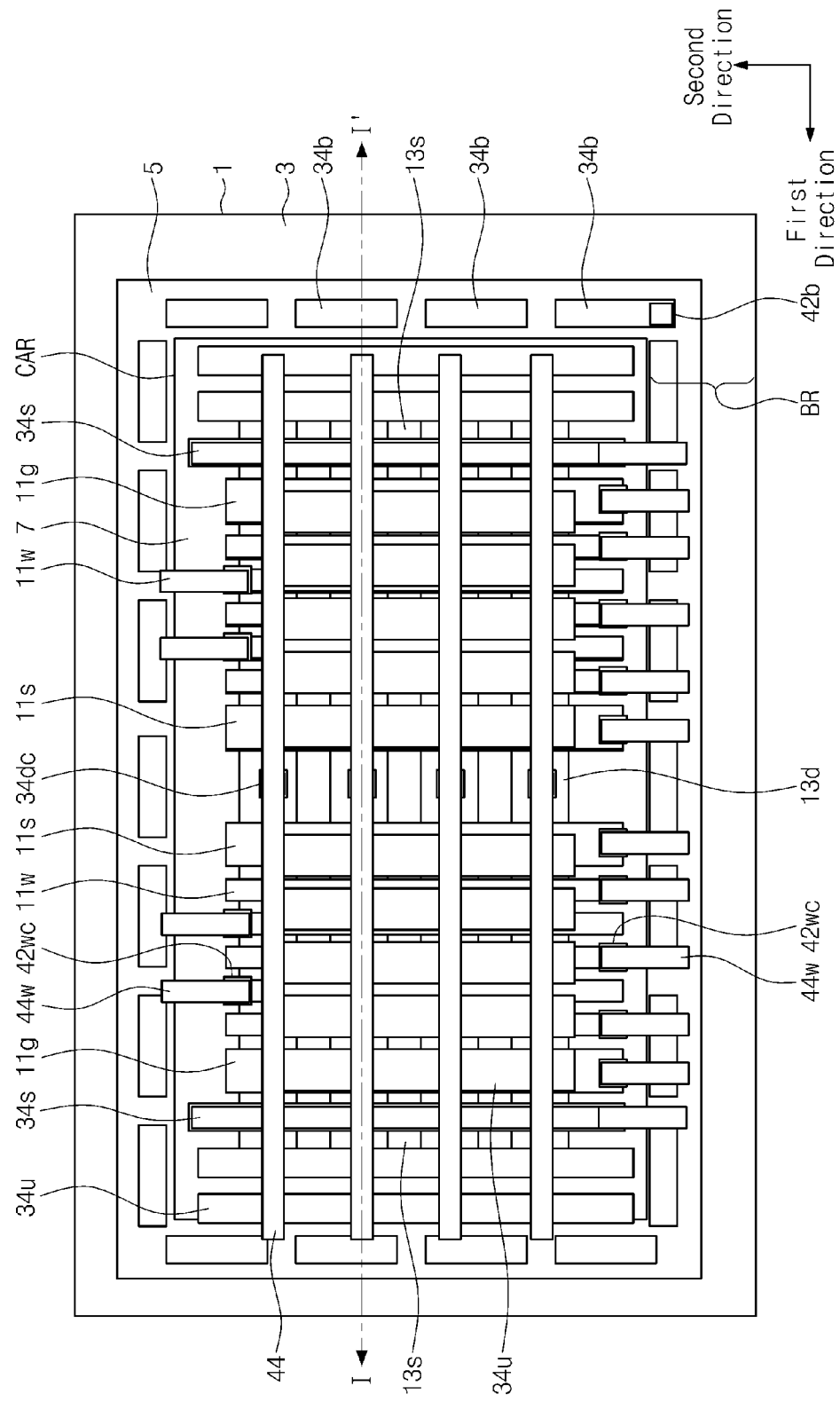
FIG. 5C is an exemplary plan view illustrating the semiconductor device of FIG. 5A.

Subsequent processes will now be described. FIG. 5C is a plan view illustrating the semiconductor of FIG. 5A.

Referring to FIGS. 5A, 5B and 5C, a second interlayer dielectric 40 may be stacked on the whole surface of the semiconductor substrate 1 in the state of FIG. 4B. Then, a second bit line contact 42dc, which passes through the second interlayer dielectric 40 and contacts the first bit line contact 34dc, may be formed. When the second bit line contact 42dc is formed, a common source contact 42cs, a second ground selection line contact 42gc, a second word line contact 42wc, a second string selection line contact 42sc, and a lateral hydrogen blocking contact 42b may be simultaneously formed. The common source contact 42cs, the second ground selection line contact 42gc, the second word line contact 42wc, the second string selection line contact 42sc, and the lateral hydrogen blocking contact 42b may contact the first common source interconnection 34cs, the first ground selection line contact 34gc, the first word line contact 34wc, the first string selection line contact 34sc, and the lateral hydrogen blocking pattern 34b, respectively. A plurality of bit lines 44 extending in the first direction may be formed on the second interlayer dielectric 40. While the bit lines 44 are formed, a second common source interconnection 44cs, a ground selection interconnection 44g, a word line interconnection 44w, and a string selection interconnection 44ss may be formed. Although not shown, on a predetermined region of the cell array region CAR, the lateral hydrogen blocking contact 42b may be connected to an interconnection electrically connected to the first type impurity implantation region 9. A ground voltage may be applied to the lateral hydrogen blocking pattern 34b through the lateral hydrogen blocking contact 42b. In one embodiment, the upper hydrogen blocking pattern 34u is floated.

In the semiconductor device, the lateral hydrogen blocking pattern 34b may surround the cell array region CAR to prevent hydrogen from laterally diffusing. The lateral hydrogen blocking pattern 34b may be provided as a plurality of blocks, in one embodiment each block having a T-shaped cross-section, arranged in a wall-shaped pattern with spaces between each block. The lateral hydrogen blocking patterns may extend vertically from the semiconductor substrate 1 to prevent the hydrogen from laterally diffusing into the cell array region CAR, and may be disposed in bar shapes spaced apart from each other to prevent falling of the lateral hydrogen blocking patterns 34b during a planarization process. The upper hydrogen blocking pattern 34u can prevent the diffusion of hydrogen from the upper surface above the semiconductor device to cell gate patterns below the hydrogen blocking pattern 34u. Accordingly, a reliable semiconductor device can be formed, such that data of a plurality of bits may be reliably stored in the floating gate pattern 112.

In one embodiment, because the lateral hydrogen blocking pattern 34b and the upper hydrogen blocking pattern 34u are formed at the same time that the first bit line contact 34dc is formed, a reliable semiconductor device can be formed without an additional process steps.

<Second Embodiment>

Figure 8:
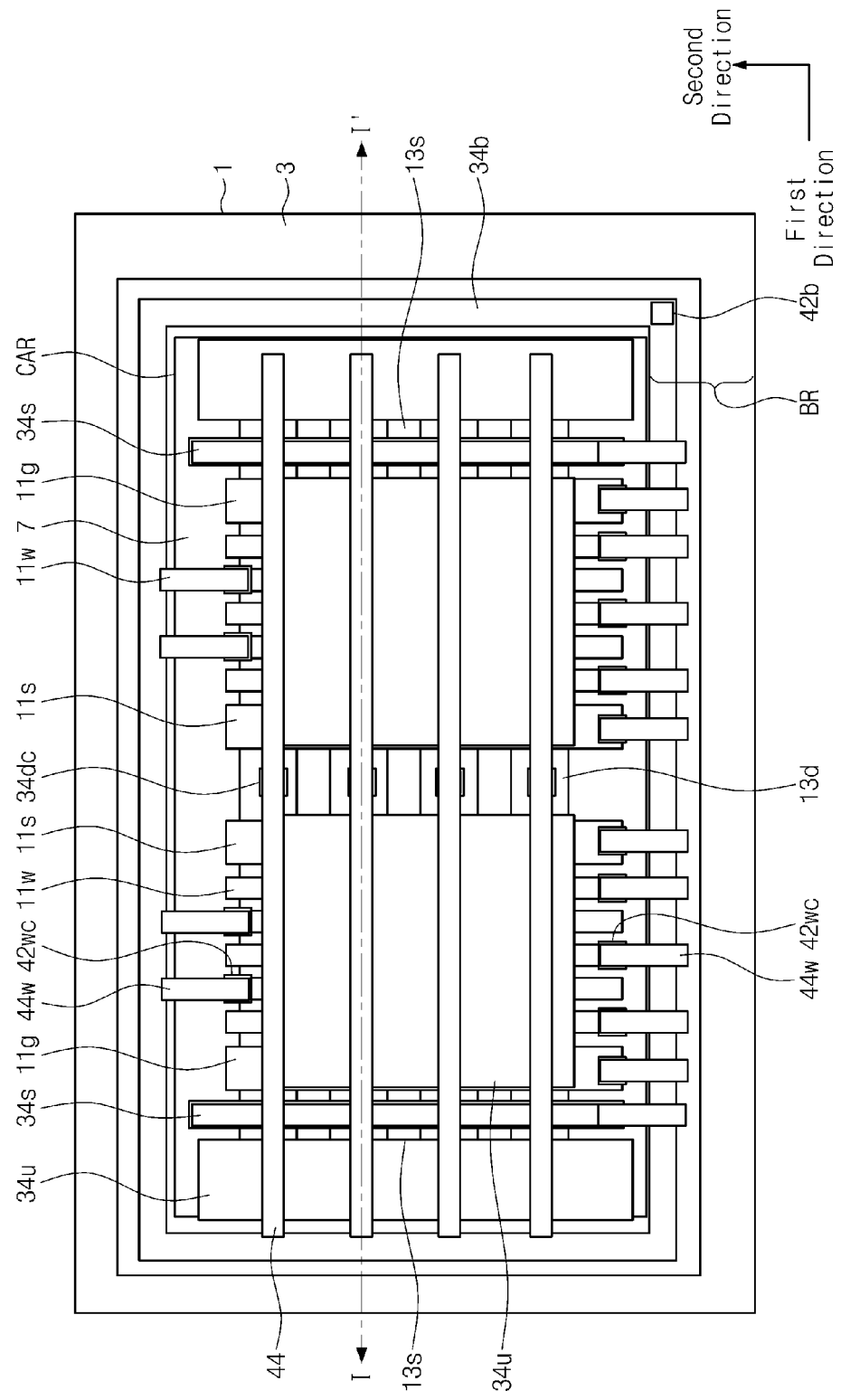
FIG. 8 is an exemplary plan view illustrating the semiconductor device of FIG. 7.
Figure 9:
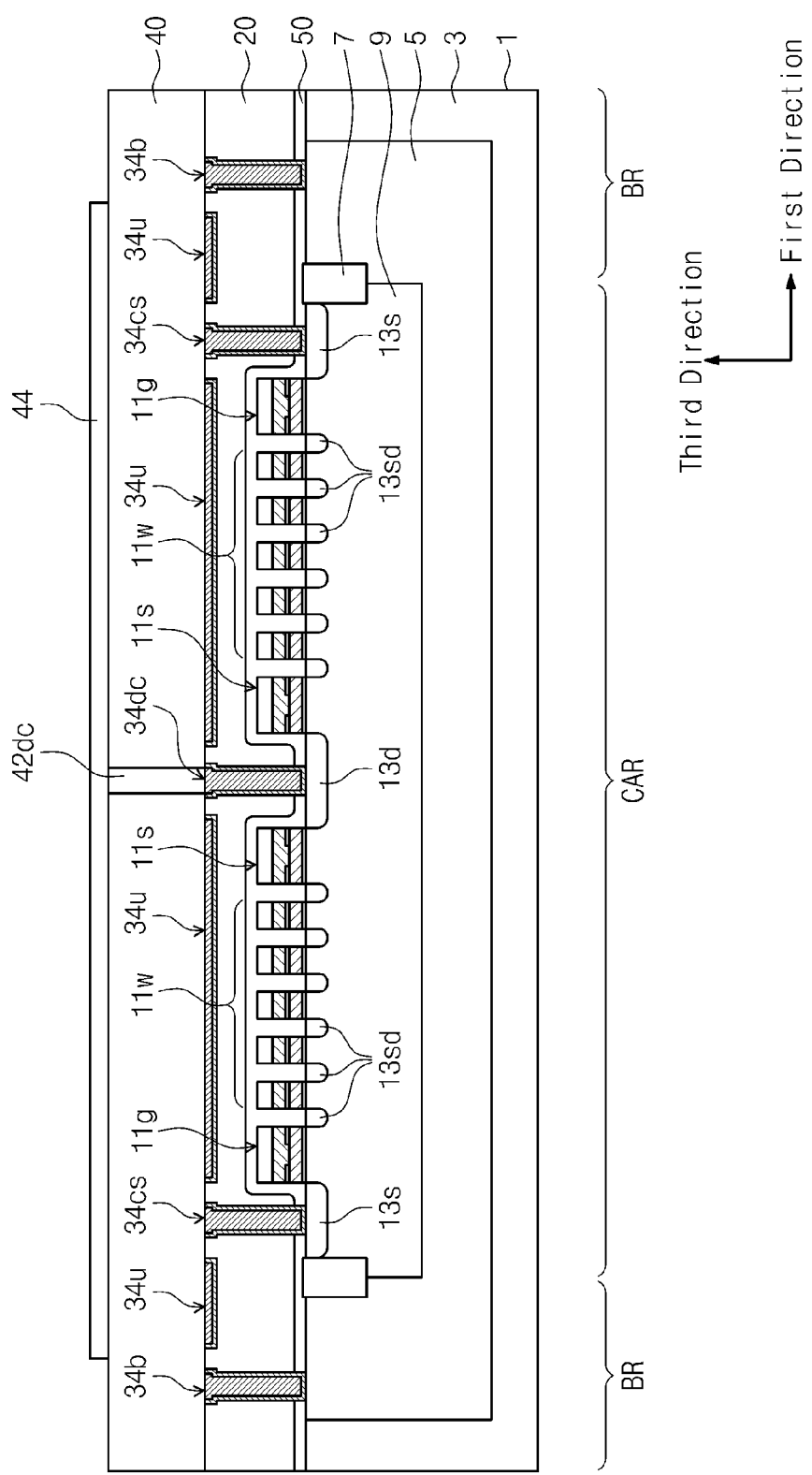
FIG. 9 is an exemplary cross-sectional view taken along line I-I' of FIG. 7 or 8.

FIG. 7 is a perspective view illustrating an exemplary semiconductor device according to another embodiment of the inventive concept. FIG. 8 is an exemplary plan view illustrating the semiconductor device of FIG. 7. FIG. 9 is an exemplary cross-sectional view taken along line I-I' of FIG. 7 or 8.

In the semiconductor device according to the current embodiment, the lateral hydrogen blocking pattern 34b may form a wall along the edges of the cell array region, and may have a closed shape (e.g., a rectangular shape) surrounding the cell array region CAR. The upper hydrogen blocking pattern 34u may have a flat plate shape covering all or portions of the cell array region. Accordingly, the invasion of hydrogen from the lateral and upper sides of the semiconductor device can be maximally prevented. The lateral hydrogen blocking pattern 34b and upper hydrogen blocking pattern 34u may be formed using a similar process as described above in connection with FIGS. 4A-4C, 5A-5C, and 6A-6C.

The other configurations may be the same/similar to those of the previous embodiments.

<Third Embodiment>

Figure 10:
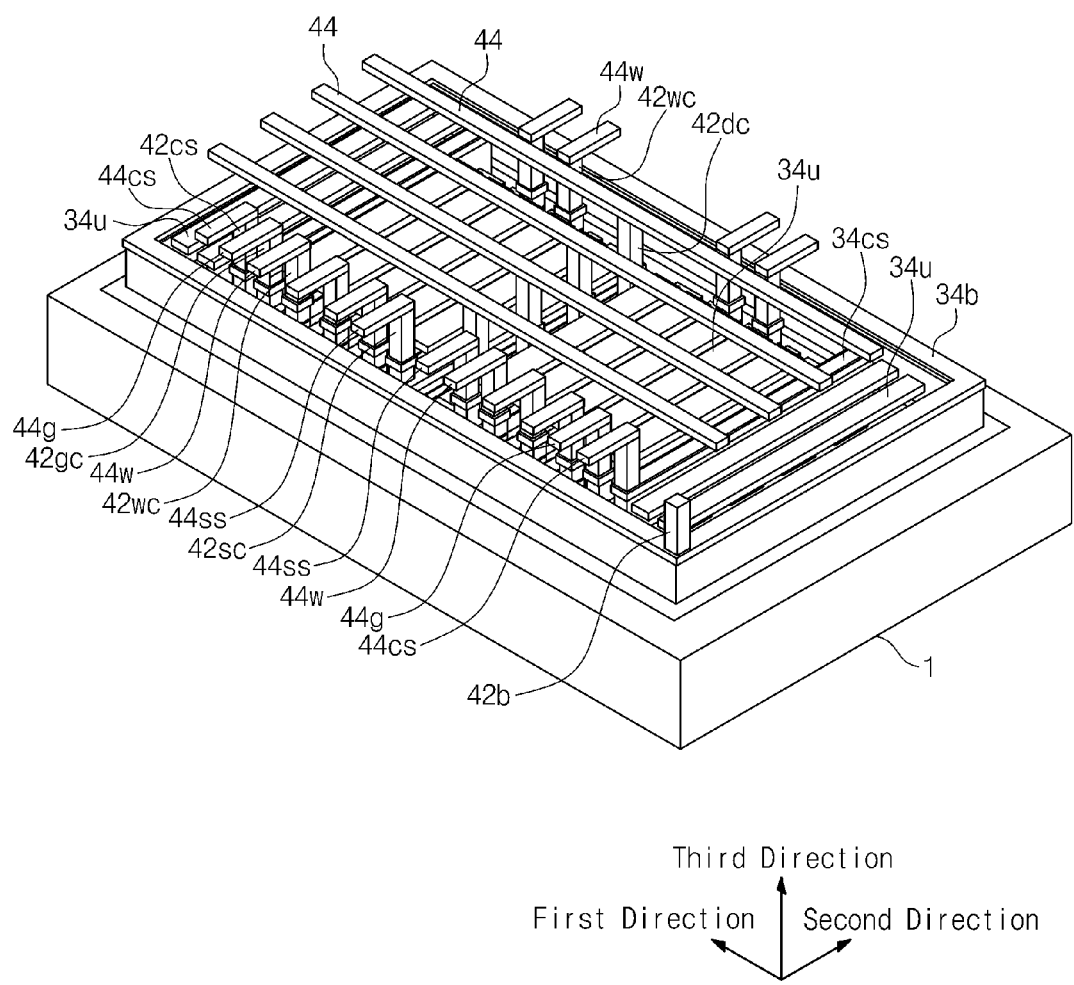
FIG. 10 is a perspective view illustrating an exemplary semiconductor device according to another embodiment of the inventive concept.
Figure 11:
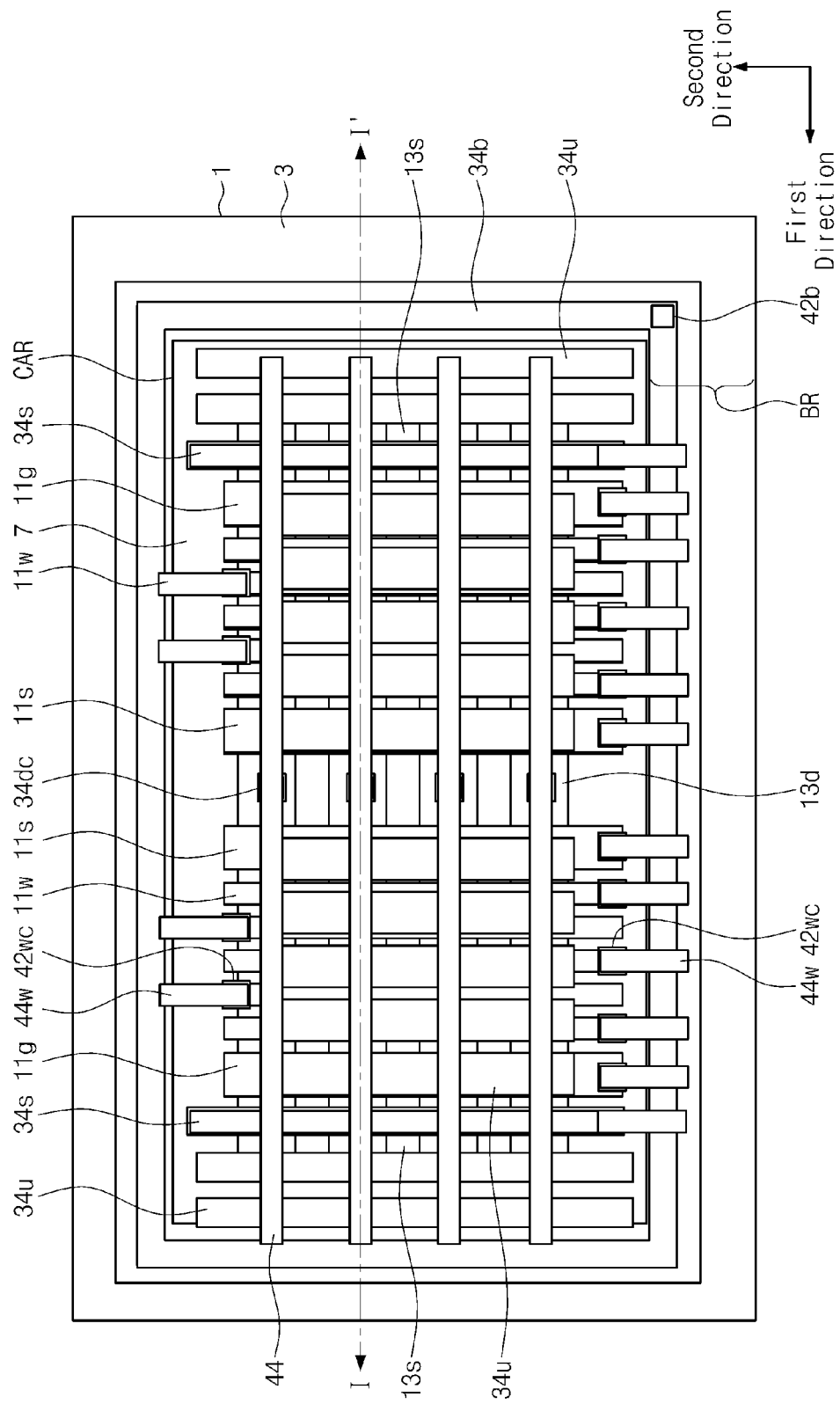
FIG. 11 is an exemplary plan view illustrating the semiconductor device of FIG. 10.

FIG. 10 is a perspective view illustrating an exemplary semiconductor device according to another embodiment of the inventive concept. FIG. 11 is a plan view illustrating the semiconductor of FIG. 10.

A cross-section taken along line I-I' of FIGS. 10 and 11 may be the same as FIG. 5B.

Referring to FIGS. 10 and 11, the lateral hydrogen blocking pattern 34b may horizontally have a closed shape surrounding the cell array region CAR. The upper hydrogen blocking patterns 34u may horizontally have a plurality of bar shapes extending in parallel lines in the second direction. The other configurations may be the same as those of the first embodiment.

<Fourth Embodiment>

Figure 12:
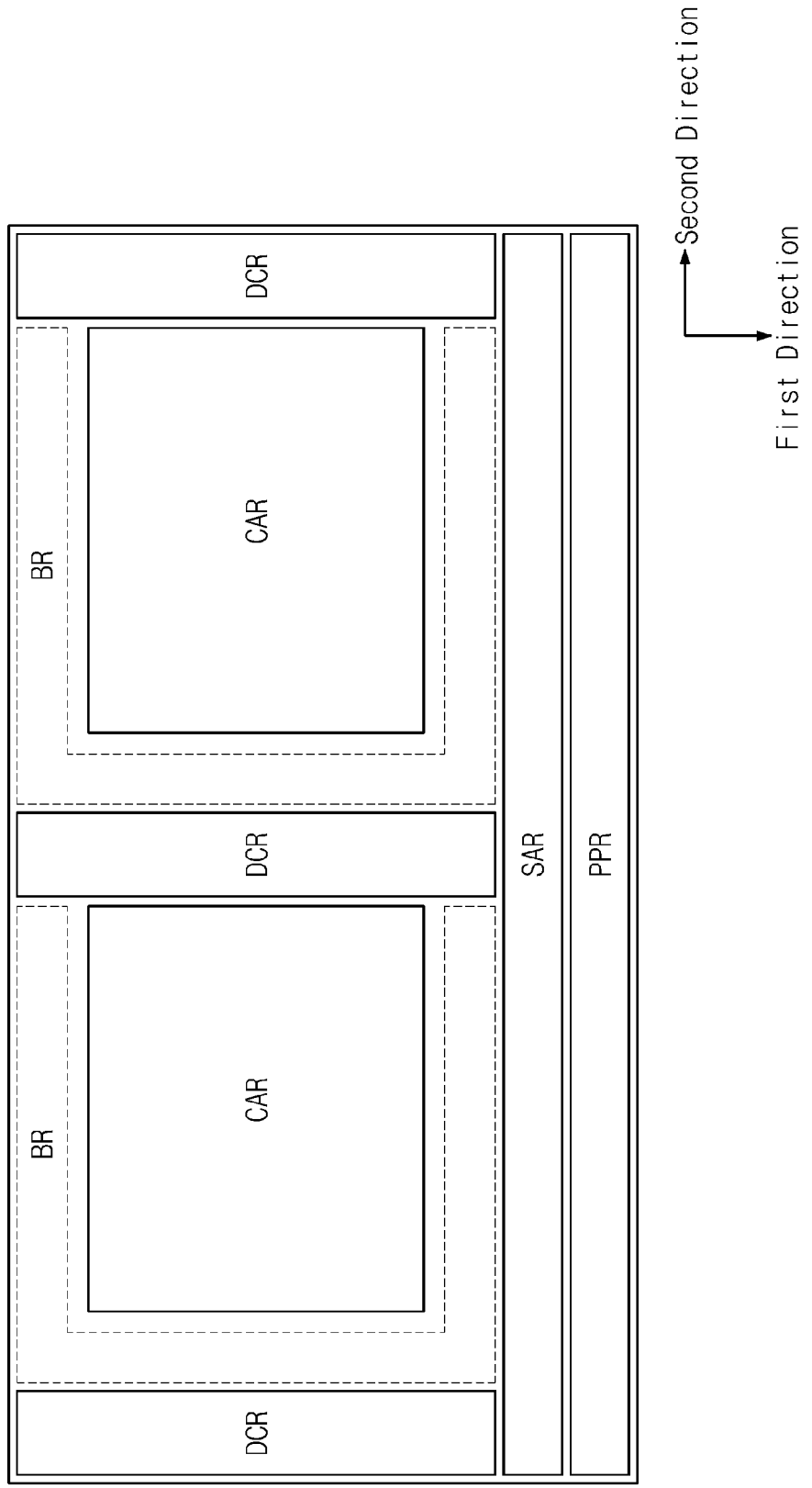
FIG. 12 is a plan view illustrating an exemplary semiconductor device according to another embodiment of the inventive concept.

FIG. 12 is a plan view illustrating a semiconductor device according to another embodiment of the inventive concept.

Referring to FIG. 12, in the semiconductor device of the present embodiment, a boundary region BR may horizontally have a U shape surrounding a cell array region CAR. Also, a lateral hydrogen blocking pattern 34b may horizontally have a U shape surrounding the cell array region CAR. The other configurations may be the same as those of the first embodiment.

Although not shown in the above embodiments, the upper hydrogen blocking pattern 34u may be formed in various additional shapes, including other bar shapes, plane shapes such as net shape or island shapes spaced apart from each other, or other patterns.

Figure 13:
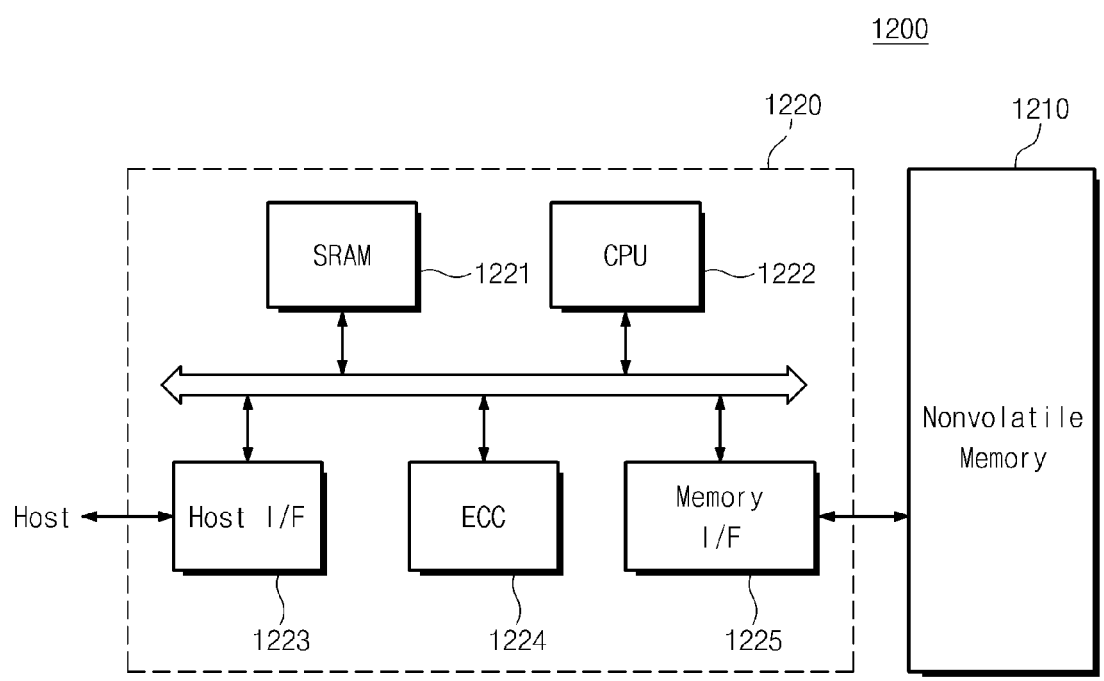
FIG. 13 is a block diagram illustrating an exemplary memory card including a non-volatile memory device according to an embodiment of the inventive concept.

FIG. 13 is a block diagram illustrating an exemplary memory card 1200 including a semiconductor device according to an embodiment of the inventive concept.

Referring to FIG. 13, the memory card 1200 for supporting high-capacity data storage includes a non-volatile memory device 1210 that is one of the semiconductor devices according to the inventive concept. The memory card 1200 may include a memory controller 1220 for controlling various general data exchanges between a host and the memory device 1210.

In one embodiment, a static random access memory (SRAM) 1221 is used as an operating memory of a central processing unit (CPU) 1222. A host interface (I/F) 1223 may include a data exchange protocol of a host connected to the memory card 1200. An error correction code (ECC) block 1224 detects and corrects an error in data read from the multi-bit non-volatile memory device 1210. A memory interface (I/F) 1225 interfaces with the non-volatile memory device 1210. The processing unit 1222 performs various general control operations for data exchange of the memory controller 1220. Although not illustrated in the drawings, it is apparent to those skilled in the art that the memory card 1200 may further include ROM (not shown) for storing code data to interface with a host. In addition, the semiconductor device described herein can be used in other types of memory.

According to the above non-volatile memory device and memory card, or a memory system, a highly reliable memory system can be provided through the non-volatile memory device 1210 where, for example, erase properties of dummy cells are improved. In one embodiment, a memory system such as a solid state disk (SSD) may include the non-volatile memory device according to the inventive concept. In this case, by preventing read errors caused by dummy cells, a highly reliable memory system can be realized.

Figure 14:
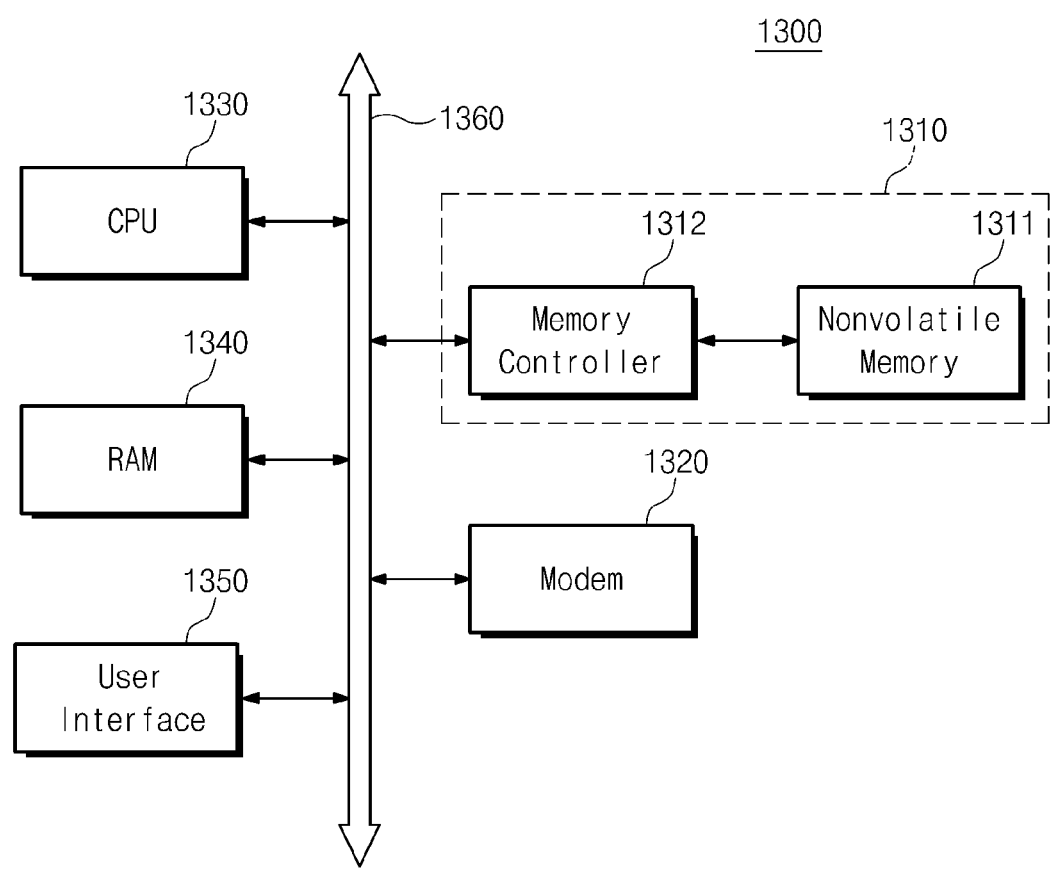
FIG. 14 is a block diagram illustrating an exemplary information processing system equipped with a non-volatile memory system according to an embodiment of the inventive concept.

FIG. 14 is a block diagram illustrating an exemplary information processing system 1300 equipped with a non-volatile memory system 1310 according to an embodiment of the inventive concept.

Referring to FIG. 14, the information processing system 1300 such as a mobile device or a desktop computer is equipped with the non-volatile memory system 1310. The information processing system 1300 may include a non-volatile memory system 1310, a modem 1320, a central processing unit (CPU) 1330, a RAM 1340, and a user interface 1350, which are connected to a system bus 1360. The non-volatile memory system 1310 may have substantially the same configuration as that of the above mentioned memory system or non-volatile memory system. The non-volatile memory system 1310 stores data processed by the CPU 1330 or data input from the outside. Here, the non-volatile memory system 1310 may include SSD, and in this case, the information processing system 1300 can stably store high capacity data in the non-volatile memory system 1310. Moreover, as its reliability is enhanced, the non-volatile memory system 1310 can save a resource consumed for an error correction, such that a high speed data exchange function can be provided to the information processing system 1300. Although not illustrated in the drawings, it will be apparent to those skilled in the art that the information processing system 1300 may further include other devices, such as an application chipset, a camera image processor (CIS), and an input/output device.

Moreover, a non-volatile memory device or a memory system according to the inventive concept may be mounted as various types of packages. For example, a non-volatile memory device or a memory system according to the inventive concept may be packaged and mounted using a method such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), system in package (SIP), multi chip package (MCP), wafer-level fabricated package (WFP), and wafer-level processed stack package (WSP).

Figure 15:
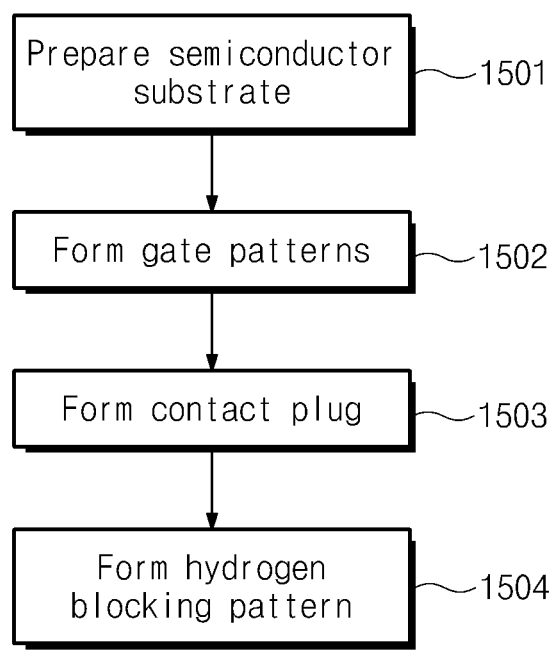
FIG. 15 depicts a method of fabricating a semiconductor device, according to exemplary embodiments.

FIG. 15 depicts a method of fabricating a semiconductor device, according to exemplary embodiments. The method includes, in step 1501, preparing a semiconductor substrate including a cell array region, a peripheral circuit region, and a boundary region disposed between the cell array region and the peripheral circuit region. For example, the semiconductor substrate may be a substrate such as shown in FIGS. 2A and 2B.

In step 1502, gate patterns are formed on the semiconductor substrate in the cell array region. The gate patterns may include control gate and floating gate patterns, such as depicted, for example, in FIGS. 3A and 3B.

In step 1503, at least one contact plug is formed on the semiconductor substrate in the cell array region. The at least one contact plug may include one or more contacts, such as a common source interconnection and a bit line contact.

In step 1504, a hydrogen blocking pattern is formed. For example, the hydrogen blocking pattern may include a lateral hydrogen blocking pattern disposed on the semiconductor substrate in the boundary region, and/or an upper hydrogen blocking pattern disposed on the semiconductor substrate in the cell array region and/or the boundary region.

Steps 1501-1504 need not necessarily occur in sequential order. For example, in one embodiment, step 1503 and 1504 occur simultaneously, such that the at least one contact plug is formed at the same time as the lateral hydrogen blocking pattern, and also at the same time as the upper hydrogen blocking pattern.

The semiconductor device according to one embodiment of the inventive concept includes the hydrogen blocking pattern disposed above a cell array region and around the circumference of the cell array region to prevent hydrogen from diffusing into the cell array region. Accordingly, hydrogen is effectively prevented from forming a trap site in a tunnel dielectric, thereby improving the reliability of the semiconductor device.

In the method of fabricating the semiconductor device according to another embodiment of the inventive concept, when a cell array contact plug is formed, the lateral hydrogen blocking pattern and the upper hydrogen blocking pattern can be formed at the same time. Thus, an additional process step for forming a hydrogen blocking pattern is unnecessary, thereby simplifying a manufacturing process.

The above-disclosed subject matter is to be considered illustrative and not restrictive, and the appended claims are intended to cover all such modifications, enhancements, and other embodiments, which fall within the true spirit and scope of the inventive concept. Thus, the scope of the inventive concept is to be determined by the broadest permissible interpretation of the following claims and their equivalents, and shall not be restricted or limited by the foregoing detailed description.

What is claimed is:

1. A semiconductor device comprising:
a semiconductor substrate including a cell array region, a peripheral circuit region, and a boundary region disposed between the cell array region and the peripheral circuit region;
a gate pattern on the semiconductor substrate in the cell array region;
at least one lateral hydrogen blocking pattern disposed on the semiconductor substrate in the boundary region to surround the cell array region; and
at least one upper hydrogen blocking pattern disposed above the gate pattern in the cell array region and spiced apart from the gate pattern, the upper hydrogen pattern not contacting the at least one lateral hydrogen blocking pattern;
wherein upper portions of the at least one upper hydrogen blocking pattern are at the same height as upper portions of the at least one lateral hydrogen blocking pattern, and
wherein the at least one lateral hydrogen blocking pattern and the at least one upper hydrogen blocking pattern do not overlap vertically.

2. The semiconductor device of claim 1, wherein the upper hydrogen blocking pattern has one of a parallel bar structure or a flat plate structure.

3. The semiconductor device of claim 1, wherein the lateral hydrogen blocking pattern and the upper hydrogen blocking pattern have upper surfaces at the same height.

4. The semiconductor device of claim 1, wherein the lateral hydrogen blocking pattern comprises a lower pattern having a first width and an upper pattern having a second width different from the first width, and a thickness of the upper pattern is same as that of the upper hydrogen blocking pattern.

5. The semiconductor device of claim 1, wherein the lateral hydrogen blocking pattern and the upper hydrogen blocking pattern comprise a conductive pattern and a titanium-containing pattern contacting a side wall and a bottom surface of the conductive pattern.

6. The semiconductor device of claim 1, wherein the upper hydrogen blocking pattern is floated.

7. The semiconductor device of claim 1, wherein the lateral hydrogen blocking pattern horizontally has a closed curve or U shape surrounding the cell array region.

8. The semiconductor device of claim 1, wherein the lateral hydrogen blocking pattern includes a plurality of blocks, each block having an upper surface that has a length and a width that are different from each other.

9. The semiconductor device of claim 1, further comprising a contact plug disposed on the semiconductor substrate in the cell array region,
wherein the lateral hydrogen blocking pattern and the contact plug have same heights.

10. The semiconductor device of claim 1, further comprising:
- a first impurity implantation region disposed in the cell array region of the semiconductor substrate; and
- a well disposed in the boundary region of the semiconductor substrate and extended to a lower part of the first impurity implantation region in the cell array region,
- wherein the lateral hydrogen blocking pattern contacts the well.

11. The semiconductor device of claim 1, wherein the gate patterns comprise a string selection line and a ground selection line parallel to each other, and a plurality of parallel word lines disposed between the string selection line and the ground selection line, and
the semiconductor device further comprises:
- a common source line interconnection disposed at a side of the ground selection line; and
- a lower bit line contact disposed at a side of the string selection line,
- wherein the common source line interconnection, the lower bit line contact, and the lateral hydrogen blocking pattern have the same heights.

12. The semiconductor device of claim 11, further comprising:
- an upper bit line contact disposed on an upper portion of the lower bit line contact; and
- a bit line contacting the upper bit line contact and crossing the word line,
- wherein the bit line has a greater height than that of an upper surface of the lateral hydrogen blocking pattern.

13. A semiconductor device comprising:
- a semiconductor substrate including a memory cell array disposed in a cell array region;
- a gate pattern disposed on the semiconductor substrate in the cell array region;
- at least one wall-shaped pattern disposed on the semiconductor substrate and surrounding the cell array region; and
- at least one bar-shaped pattern disposed on the semiconductor substrate and above the cell array region,
- wherein the at least one wall-shaped pattern does not contact the at east one bar-shaped pattern and dons not overlap the at least one bar-shaped pattern in a vertical direction,
- wherein an upper portion of the at least one bar-shaped pattern is at the same height as an upper portion of the at cast one wall-shaped pattern,
- wherein each of the wall-shaped pattern and the bar-shaped pattern comprises a material that blocks gas containing hydrogen, and
- wherein each of the wall-shaped pattern and the bar-shaped pattern is configured to block the gas containing hydrogen from reaching the memory cell array.

14. The semiconductor device of claim 13, wherein:
a top surface of the wall-shaped pattern is positioned above a top surface of the gate pattern, and a bottom surface of the wall-shaped pattern is positioned below the top surface of the gate pattern.

15. The semiconductor device of claim 13, wherein the wall-shaped pattern and the bar-shaped pattern have surfaces at the same height.

16. A semiconductor device comprising:
- a semiconductor substrate including a cell array region, a peripheral circuit region, and a boundary region disposed between the cell array region and the peripheral circuit region;
- a gate pattern on the semiconductor substrate in the cell array region;
- at least one lateral hydrogen blocking pattern disposed on the semiconductor substrate in the boundary region to surround the cell array region;
- a first impurity implantation region disposed in the cell array region of the semiconductor substrate; and
- a well disposed in the boundary region of the semiconductor substrate and extended to a lower part of the first impurity implantation region in the cell array region,
- wherein the lateral hydrogen blocking pattern contacts the well.

* * * * *